United States Patent
Tsai et al.

(10) Patent No.: US 12,431,428 B2
(45) Date of Patent: Sep. 30, 2025

(54) INTEGRATED CIRCUITS AND METHODS FOR POWER DELIVERY

(71) Applicant: Taiwan Semiconductor Manufacturing Company, Ltd., Hsinchu (TW)

(72) Inventors: Ming Chian Tsai, Hsinchu (TW); Shih-Wei Peng, Hsinchu (TW); Wei-Cheng Lin, Taichung (TW); Jiann-Tyng Tzeng, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 540 days.

(21) Appl. No.: 17/459,840

(22) Filed: Aug. 27, 2021

(65) Prior Publication Data

US 2023/0069137 A1    Mar. 2, 2023

(51) Int. Cl.
*H01L 23/522* (2006.01)
*H01L 21/768* (2006.01)
*H01L 23/48* (2006.01)
*H01L 23/528* (2006.01)

(52) U.S. Cl.
CPC .... *H01L 23/5286* (2013.01); *H01L 21/76895* (2013.01); *H01L 23/481* (2013.01); *H01L 23/5226* (2013.01)

(58) Field of Classification Search
CPC ..... H01L 23/48; H01L 23/481; H01L 23/522; H01L 23/528; H01L 23/538; H01L 23/5226; H01L 23/5286; H01L 23/5386; H01L 21/768; H01L 21/8238; H01L 21/76895; H01L 21/823871; H01L 27/092; H10D 84/01; H10D 84/0186; H10D 84/03; H10D 84/038; H10D 84/85; H10D 88/00; H10D 88/01
USPC ...................................................... 257/773
See application file for complete search history.

(56) References Cited

U.S. PATENT DOCUMENTS

| | | | |
|---|---|---|---|
| 2019/0181130 A1* | 6/2019 | Do | H01L 27/11807 |
| 2021/0118798 A1* | 4/2021 | Liebmann | H01L 23/5283 |
| 2021/0358902 A1* | 11/2021 | Kang | H01L 23/535 |

* cited by examiner

*Primary Examiner* — Chuong A Luu
(74) *Attorney, Agent, or Firm* — Finnegan, Henderson, Farabow, Garrett & Dunner, L.L.P.

(57) ABSTRACT

An integrated circuit includes a first power rail, a second power rail, and a power tap cell. The first power rail is at a first side of the integrated circuit. The second power rail is at a second side of the integrated circuit. The first and second sides are on opposite sides of at least a complementary field effect transistor. The power tap cell is coupled to the first power rail and the second power rail and configured to provide power from the first power rail to the second power rail.

20 Claims, 29 Drawing Sheets

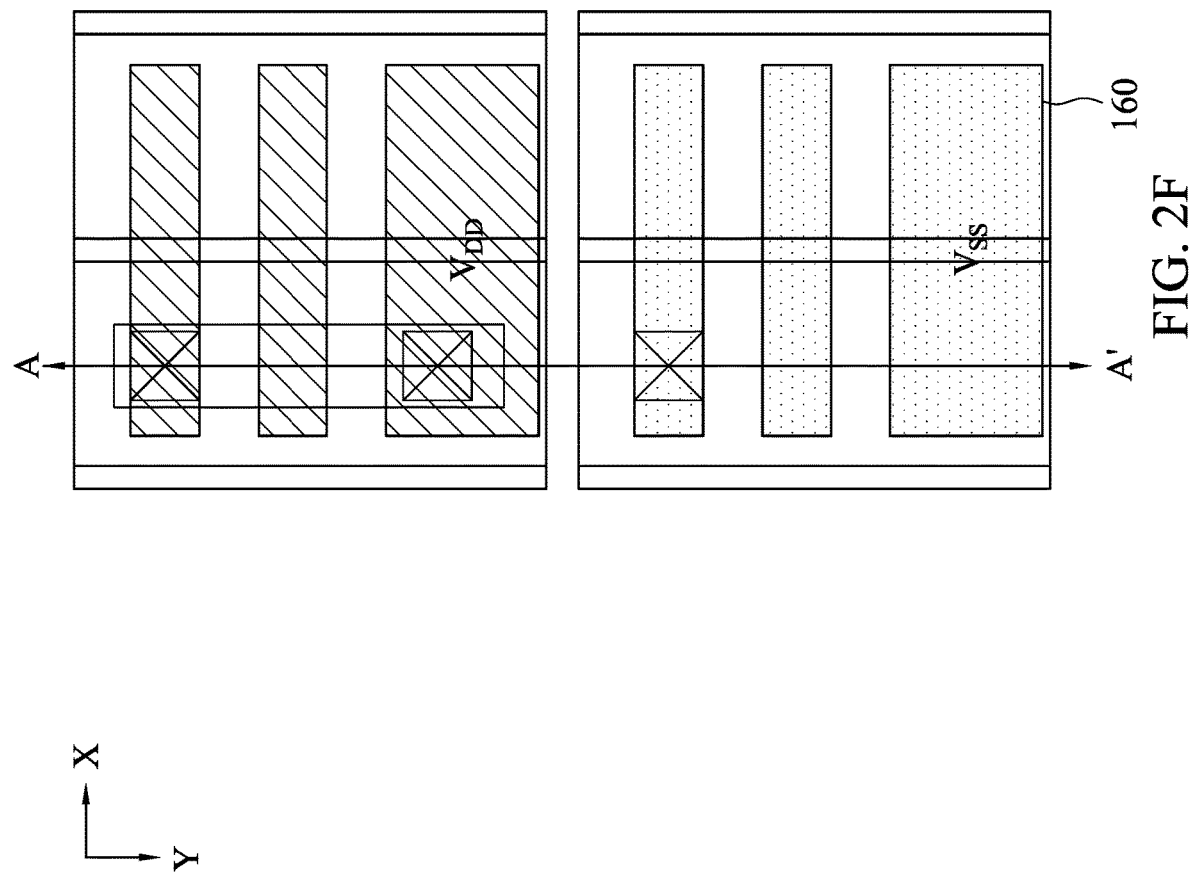

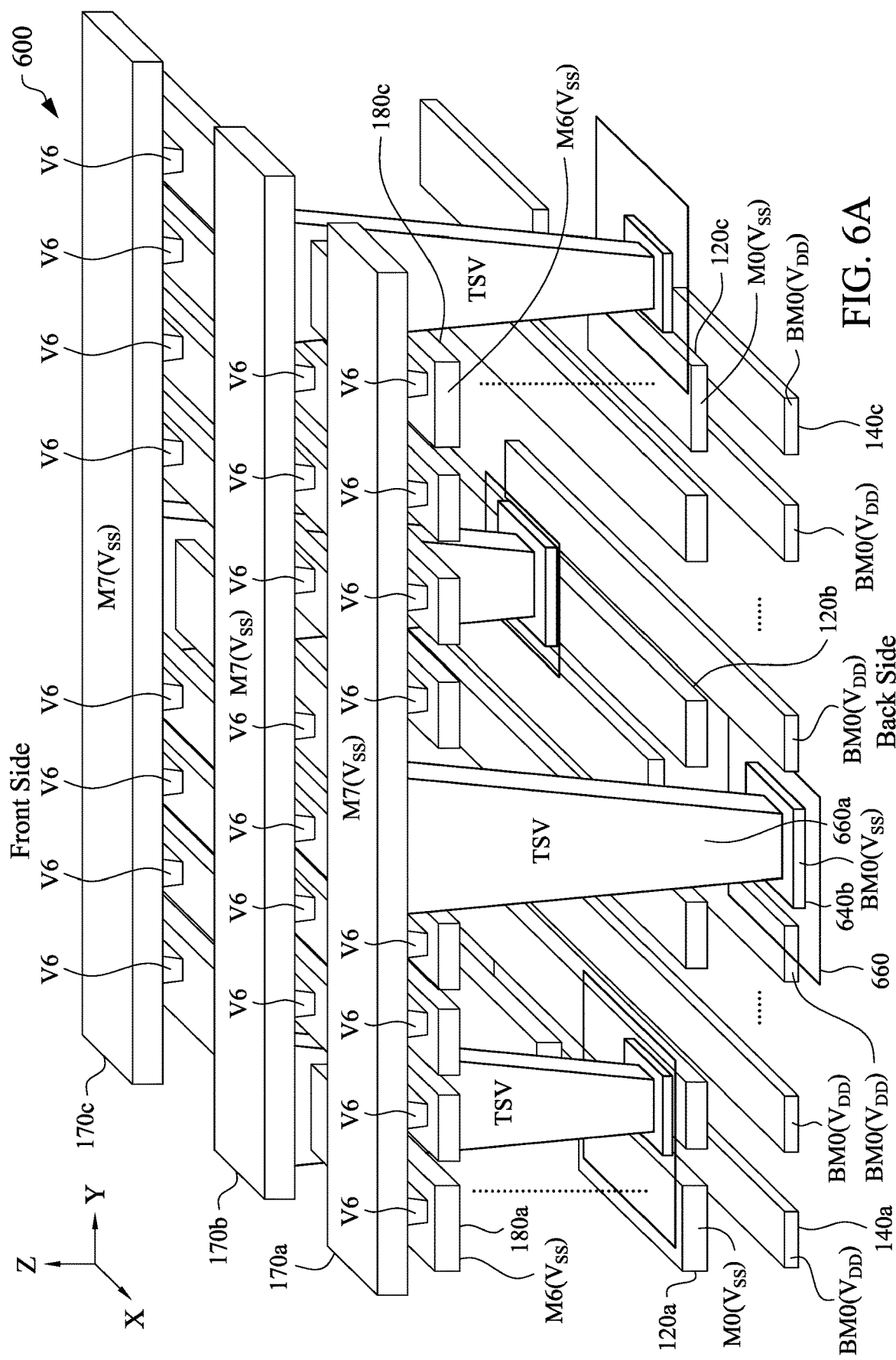

INTEGRATED CIRCUITS AND METHODS FOR POWER DELIVERY

BACKGROUND

The present disclosure relates to integrated circuits and methods for power delivery.

Integrated circuits need to deliver power to different parts of the integrated circuits. The integrated circuits also need to deliver power in efficient ways. The integrated circuits may include different circuits and methods for power delivery.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2F illustrates a top view of a diagram of the exemplary power tap cell in the second exemplary integrated circuit, in accordance with some embodiments.

FIG. 6A illustrates a perspective view of a diagram of a sixth exemplary integrated circuit including power tap cells for power delivery, in accordance with some embodiments.

DETAILED DESCRIPTION

Figure 1:
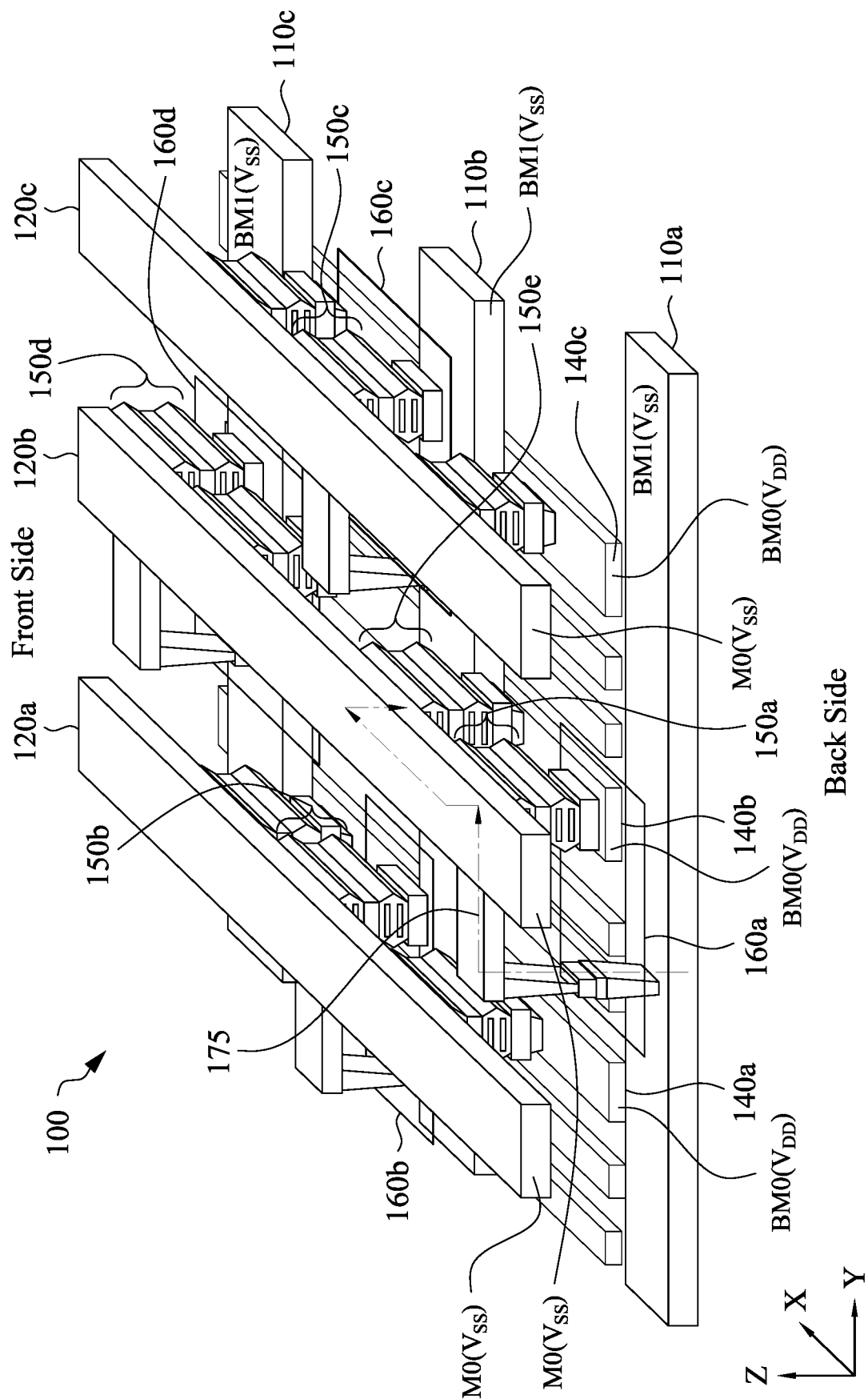
FIG. 1 illustrates a perspective view of a diagram of a first exemplary integrated circuit for power delivery, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

For integrated circuits, power may need to be delivered to different sides of the integrated circuits. For example, a complementary field effect transistor (CFET) integrated circuit includes p-channel metal-oxide-semiconductor (PMOS) field-effect transistors and n-channel metal-oxide-semiconductor (NMOS) field-effect transistors. The PMOS and NMOS transistors are stacked vertically with common gates. This structure simplifies access to the transistors. It may also allow standard cells to be scaled down to four tracks or even three tracks with buried power rails. However, such a structure requires power to be delivered to two sides of the CFET integrated circuit. The CFET integrated circuit may have, for example, back-side power rails. Thus, power distribution from the back side to the front side is needed for the CFET integrated circuit.

In accordance with some embodiments, an integrated circuit includes a first power rail, a second power rail, and a power tap cell. The first power rail is at a first side of the integrated circuit. The second power rail is at a second side of the integrated circuit. The power tap cell is coupled to the first power rail and the second power rail and configured to provide power from the first power rail to the second power rail.

In some embodiments, the integrated circuit includes one or more complementary field effect transistors (CFETs). The first side is a back side of the integrated circuit. The second side is a front side of the integrated circuit. The first power rail is configured to provide a negative voltage level to the integrated circuit, such as a voltage of ground level or a voltage source supply ($V_{SS}$). The power tap cell delivers power from the back side to the front side of the CFET integrated circuit.

FIG. 1 illustrates a perspective view of a diagram of a first exemplary integrated circuit 100 for power delivery, in accordance with some embodiments. The perspective view of the diagram of integrated circuit 100 is in a three-dimensional representation with x, y, and z reference axes. Integrated circuit 100 includes metal lines 110a, 110b, and 110c, metal lines 120a, 120b, and 120c, metal lines 140a, 140b, and 140c, CFETs 150a, 150b, 150c, 150d, and 150e and other CFETs (not labelled), and power tap cells 160a, 160b, 160c, and 160d.

As shown in FIG. 1, metal lines 110a, 110b, and 110c are in the second metal layer at the back side (i.e., BM1) of integrated circuit 100. Metal lines 120a, 120b, and 120c are in the first metal layer at the front side (i.e., M0) of integrated circuit 100. Metal lines 140a, 140b, and 140c are in the first metal layer at the back side (i.e., BM0) of integrated circuit 100. CFETs 150a and 150d are respectively coupled between metal lines 120b and 140b. CFET 150b is coupled between metal lines 120a and 140a. CFET 150c is coupled between metal lines 120c and 140c. Each of CFETs 150a, 150b, 150c, and 150d includes an NMOS transistor (upper part on the Z axis) and a PMOS transistor (lower part on the Z axis), and the NMOS transistor is stacked on the PMOS transistor. Integrated circuit 100 may also include other metal lines in the same or different layers on either side.

Integrated circuit 100 includes a power delivery network at the back side. The power delivery network includes metal lines 110a, 110b, and 110c configured to deliver a negative voltage level (i.e., $V_{SS}$) in the second metal layer at the back side (i.e., BM1). The power delivery network also includes metal lines 140a, 140b, and 140c configured to deliver a positive voltage level (i.e., $V_{DD}$) in the first metal layer at the back side (i.e., BM0). In other words, integrated circuit 100 includes power rails of $V_{SS}$ (i.e., metal lines 110a, 110b, and 110c) and power rails of $V_{DD}$ (metal lines 140a, 140b, and 140c) at the back side.

Integrated circuit 100 also includes metal lines 120a, 120b, and 120c configured to deliver the negative voltage level (i.e., $V_{SS}$) in the first metal layer at the front side (i.e., M0). The NMOS of CFETs can be configured to be supplied with the negative voltage level $V_{SS}$ through metal lines 120a, 120b, and 120c.

Integrated circuit 100 also includes power tap cells 160a, 160b, 160c, and 160d configured to deliver the negative voltage level $V_{SS}$ from the power rails of $V_{SS}$ (i.e., metal lines 110a, 110b, and 110c) at the back side to metal lines 120a, 120b, and 120c at the front side of integrated circuit 100. As shown in FIG. 1, CFET 150a is coupled to metal line 120b at the front side through a metal-layer-to-diffusion-layer (MD) layer (e.g., MD layer 122 in FIG. 2D) and a via (e.g., via 121 in FIG. 2D). Power tap cell 160a is coupled between metal line 110a and the MD layer. Power tap cell 160a is configured to deliver a negative voltage level (i.e., $V_{SS}$) from metal line 110a at the back side to metal line 120b at the front side. As shown in FIG. 1, power tap cell 160a provides a power path 175 from the back side to the front side of integrated circuit 100. Likewise, power tap cells 160b, 160c, and 160d also provide power paths from the back side to the front side of integrated circuit 100. The back and front sides are on opposite sides of CFETs 150a, 150b, 150c, 150d, and 150e of integrated circuit 100.

In some embodiments, integrated circuit 100 may include a via structure, e.g., a feed-through via (FTV), a through-silicon via (TSV), and a via wall, to deliver the negative voltage level $V_{SS}$ from the back side to the front side, as described herein.

Figure 2A:
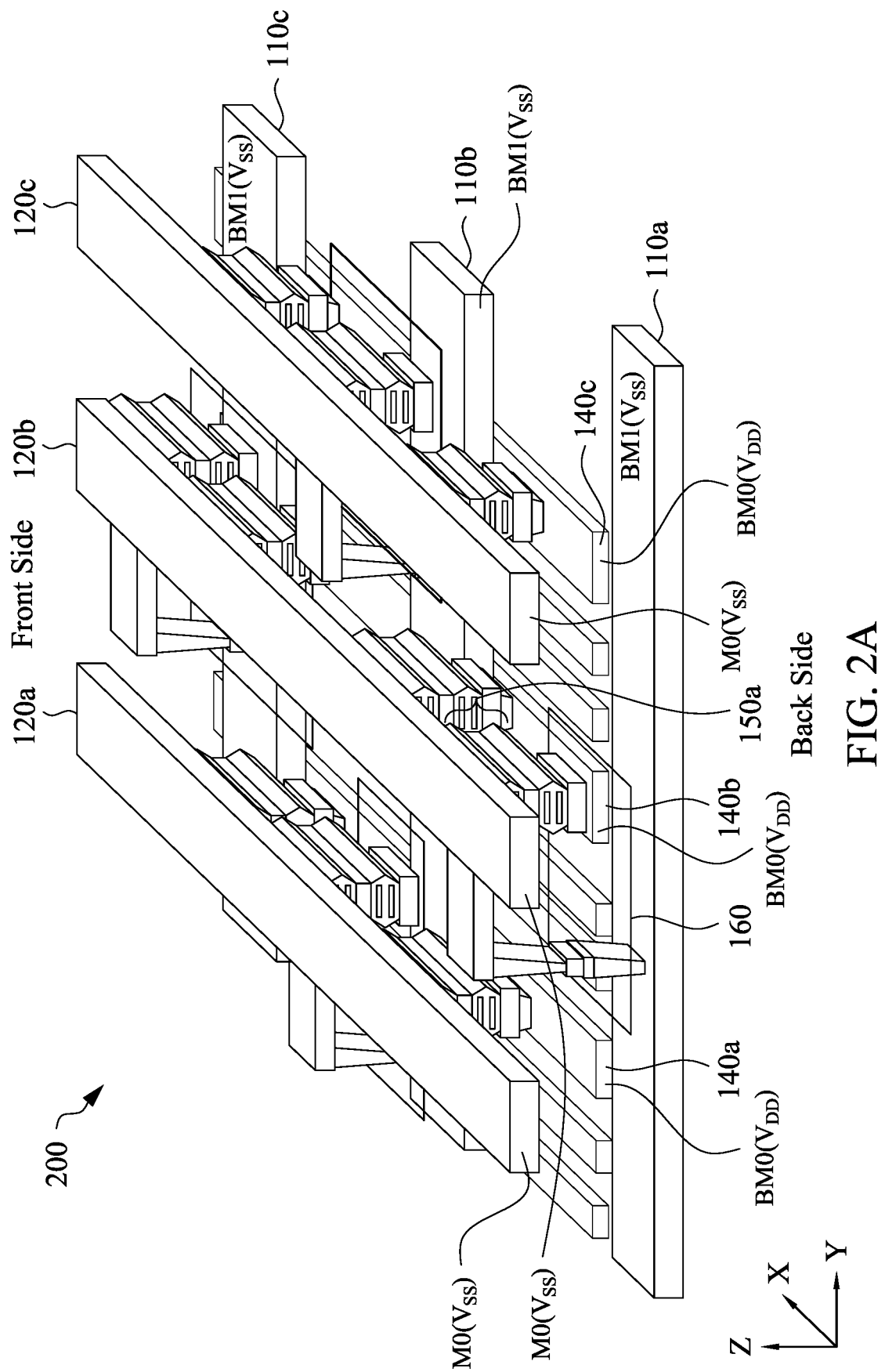
FIG. 2A illustrates a perspective view of a diagram of a second exemplary integrated circuit including power tap cells for power delivery, in accordance with some embodiments.

FIG. 2A illustrates a perspective view of a diagram of a second exemplary integrated circuit including power tap cells for power delivery, in accordance with some embodiments. The perspective view of the diagram of integrated circuit 200 is in a three-dimensional representation with x, y, and z reference axes. Integrated circuit 200 includes metal lines 110a, 110b, and 110c, metal lines 120a, 120b, and 120c, metal lines 140a, 140b, and 140c, a CFET 150a and other CFETs (not labelled), and a power tap cell 160 and other power tap cells (not labelled). These metal lines, CFETs, and power tap cells of integrated circuit 200 have the same characteristics as their counterparts in integrated circuit 100 (FIG. 1). For example, power tap cell 160 is configured to deliver a negative voltage level (i.e., $V_{SS}$) from metal line 110a at the back side to metal line 120b at the front side. The back and front sides are on opposite sides of CFET 150a of integrated circuit 200.

Figure 2B:
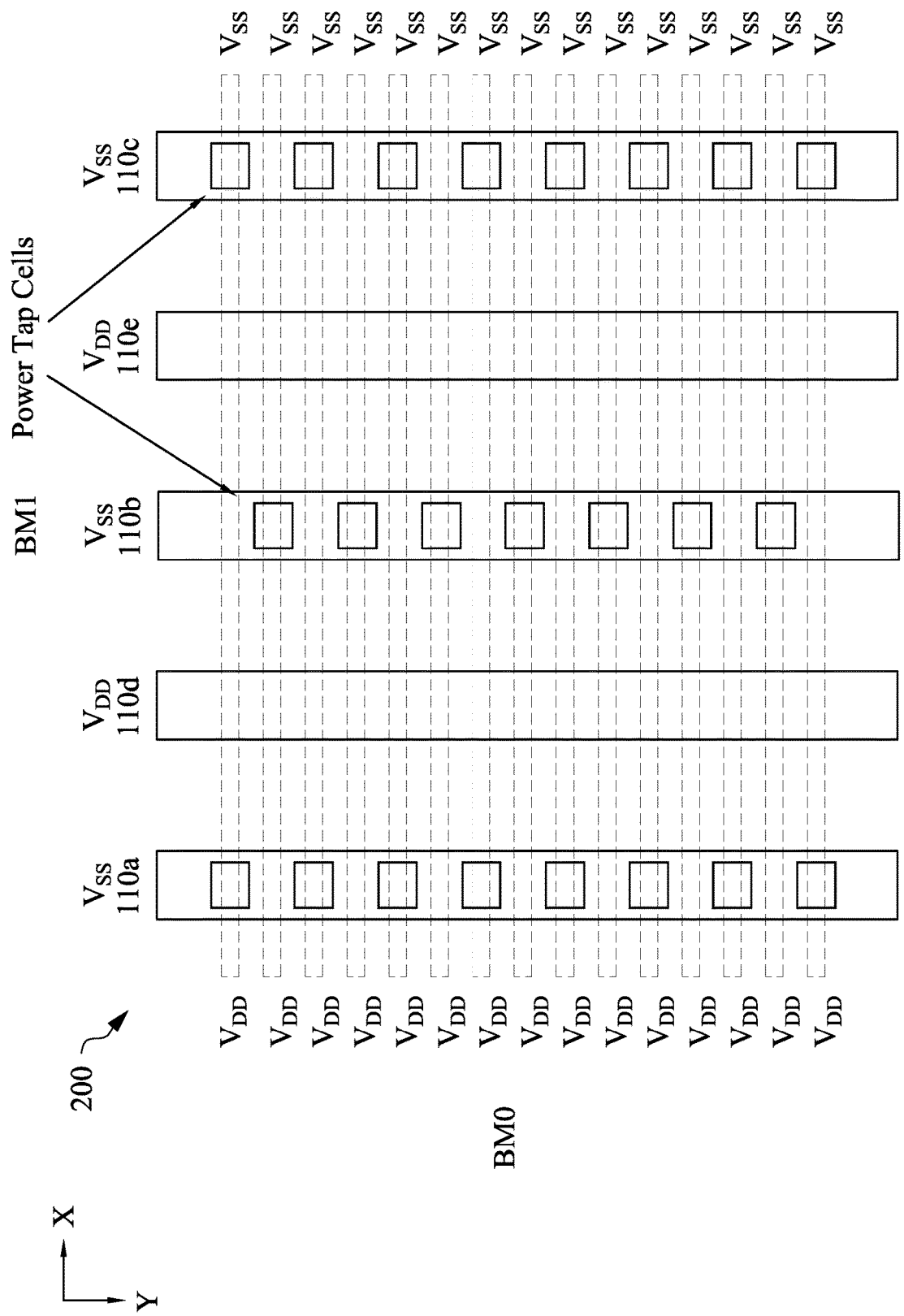
FIG. 2B illustrates a top view of a diagram of the second exemplary integrated circuit, in accordance with some embodiments.

FIG. 2B illustrates a top view of a diagram of integrated circuit 200, in accordance with some embodiments. The top view of the diagram of integrated circuit 200 is in a two-dimensional representation with x and y reference axes. Integrated circuit 200 includes metal lines 110a, 110b, 110c, 110d, and 110e in the second metal layer at the back side (i.e., BM1 in FIG. 2B). Metal lines 110a, 110b, and 110c are configured to provide a negative voltage level (i.e., $V_{SS}$) at the back side. Metal lines 110e and 110d are configured to provide a positive voltage level (i.e., $V_{DD}$) at the back side. Integrated circuit 200 also includes a plurality of metal lines in the first metal layer at the back side (i.e., BM0 in FIG.

2B). The metal lines in the first metal layer at the back side (BM0) are configured to provide a positive voltage level (i.e., $V_{DD}$).

As illustrated in FIG. 2B, integrated circuit 200 includes a plurality of power tap cells configured to deliver the negative voltage level (i.e., $V_{SS}$) from metal lines 110a, 110b, and 110c in the second metal layer at the back side (BM1) to a plurality of metal lines in the first layer at the front side (i.e., M0 in FIG. 2A).

Figure 2C:
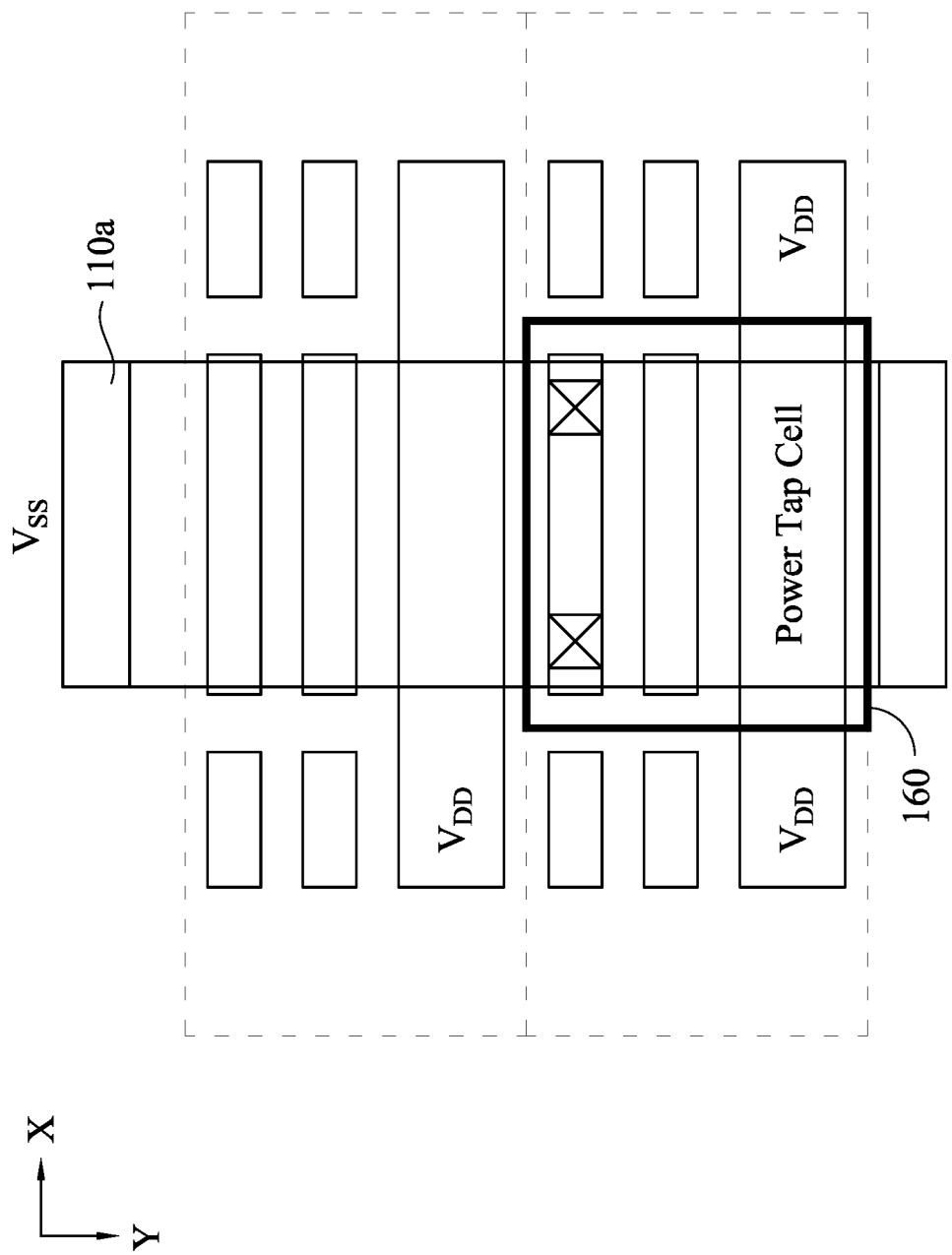
FIG. 2C illustrates a top view of a diagram of an exemplary power tap cell in the second exemplary integrated circuit, in accordance with some embodiments.

FIG. 2C illustrates a top view of a diagram of power tap cell 160 in integrated circuit 200, in accordance with some embodiments. The top view of the diagram of power tap cell 160 is in a two-dimensional representation with x and y reference axes. Power tap cell 160 is coupled to metal line 110a every two-cell height along the Y axis, as shown in FIGS. 2B and 2C.

Figure 2D:
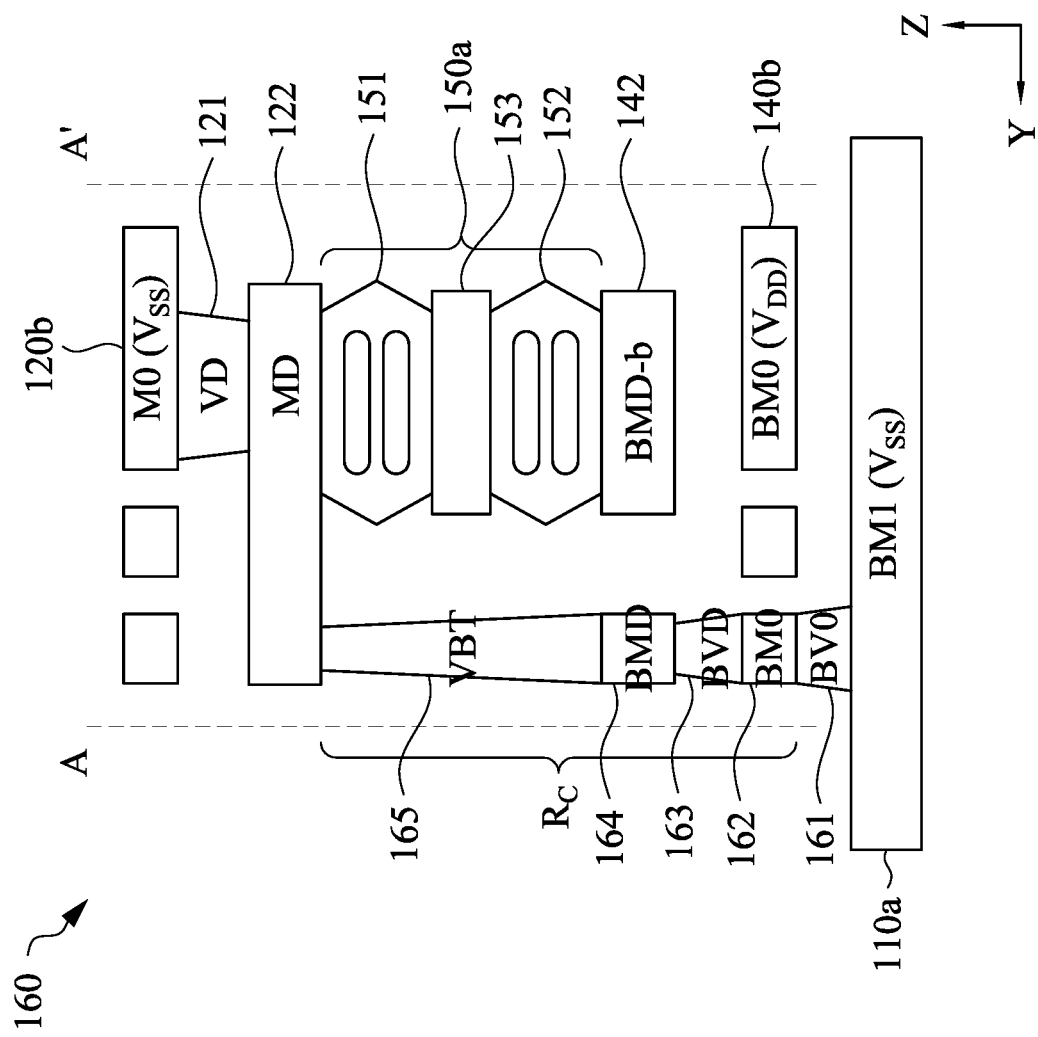
FIG. 2D illustrates a cross-sectional view of a diagram of the exemplary power tap cell in the second exemplary integrated circuit, in accordance with some embodiments.

FIG. 2D illustrates a cross-sectional view of a diagram of power tap cell 160 in integrated circuit 200, in accordance with some embodiments. The cross-sectional view of the diagram of power tap cell 160 is in a two-dimensional representation with y and z reference axes. Power tap cell 160 includes a first via 161 (i.e., BV0), a metal layer 162 (i.e., BM0), a second via 163 (i.e., BVD), a first metal diffusion (MD) layer 164 (i.e., BMD), and a third via 165 (i.e., VBT). Via 161 (BV0) is coupled between metal line 110a (BM1) and metal layer 162 (BM0) at the back side. Metal line 110a is a power rail of the negative voltage level $V_{SS}$ at the back side. Metal layer 162 (BM0) is coupled between via 161 (BV0) and via 163 (BVD). Metal layer 162 is configured to be supplied with the negative voltage level $V_{SS}$ from metal line 110a through via 161 (BV0). Via 163 (BVD) is coupled between metal layer 162 (BM0) and MD layer 164 (BMD) at the back side. MD layer 164 (BMD) is coupled between via 163 (BVD) and via 165 (VBT). Via 165 (VBT) is coupled between MD layer 164 (BMD) and an MD layer 122 (i.e., MD in FIG. 2D) at the front side. MD layer 122 (MD) is coupled to metal line 120b (M0) through a via 121 (i.e., VD in FIG. 2D) at the front side. Metal line 120b (M0) is configured to be supplied the negative voltage level $V_{SS}$ from metal layer 162 through via 163 (BVD), MD layer 164 (BMD), via 165 (VBT), MD layer 122 (MD), and via 121 (VD). Metal line 120b (M0) is a power rail of the negative voltage level $V_{SS}$ at the front side. Accordingly, power tap cell 160 is configured to deliver the negative power level $V_{SS}$ from metal line 110a (BM1) at the back side to metal line 120b at the front side.

Power tap cell 160 has a via resistance, $R_C$, over via 161 (BV0), metal layer 162 (BM0), via 163 (BVD), MD layer 164 (BMD), and via 165 (i.e., VBT). In some embodiments, the via resistance $R_C$ is high as compared to other components in integrated circuit 200.

As shown in FIG. 2D, CFET 150a includes an NMOS transistor 151 and a PMOS transistor 152. NMOS transistor 151 is stacked on PMOS transistor 152. An MD local interconnector (MDLI) 153 is coupled between NMOS transistor 151 and PMOS transistor 152. NMOS transistor 151 of CFET 150a is coupled to metal line 120b (M0) at the front side through MD layer 122 (MD) and via 121 (VD). PMOS transistor 152 of CFET 150a is coupled to metal line 140b (i.e., BM0($V_{DD}$) in FIG. 2D) through an MD layer 142 (i.e., BMD-b in FIG. 2D) at the back side.

Figure 2E:
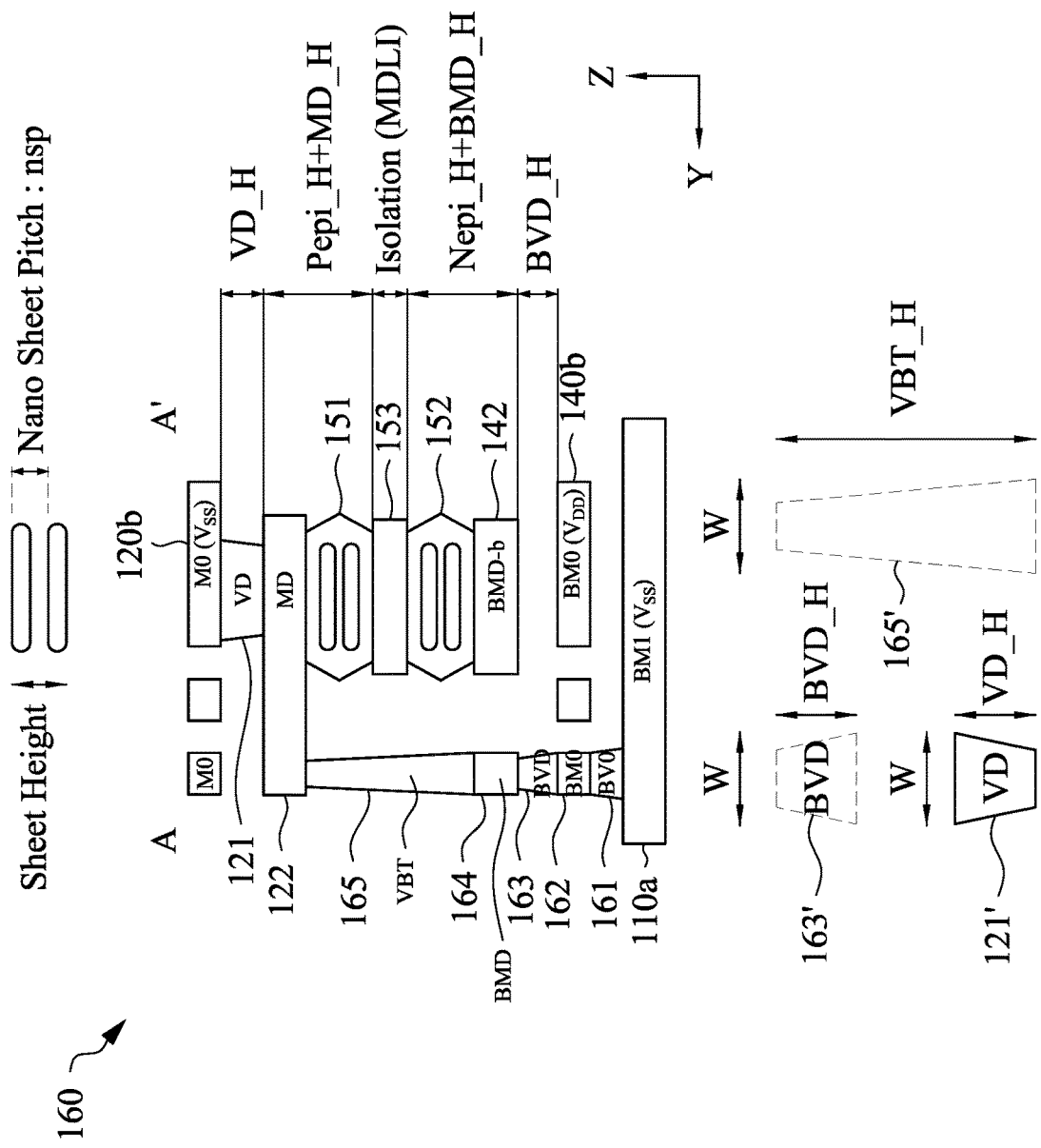
FIG. 2E illustrates exemplary geometry of the exemplary power tap cell in the second exemplary integrated circuit, in accordance with some embodiments.

FIG. 2E illustrates exemplary geometry of power tap cell 160 in integrated circuit 200, in accordance with some embodiments. The geometry of power tap cell 160 is shown in a two-dimensional representation with y and z reference axes. A sheet height in NMOS transistor 151 and PMOS transistor 152 ranges from a nano sheet pitch (nsp) to four times of the nsp, i.e., 1 nsp to 4 nsps. A height of via 121 (VD), VD_H, ranges from half of the sheet height to three times of the sheet height, i.e., 0.5 sheet height to 3 sheet heights. A height of NMOS transistor 151 and MD layer 122, Nepi_H+MD_H, ranges from a Pepi_H to 1.2 Pepi_Hs, i.e., 1 Pepi_H to 1.2 Pepi_Hs, where Nepi_H is a height of an epitaxial layer of NMOS transistor 151 and Pepi_H is a height of an epitaxial layer of PMOS transistor 152. A height of PMOS transistor 152 and MD layer 142 (BMD-b), Pepi_H+BMD_H, ranges from one sheet height to 1.2 sheet heights. A height of MDLI 153, Isolation (MDLI), ranges from 0.9 nsp to 1.1 nsps. A height of via 163 (BVD), BVD_H, ranges from half of the sheet height to three times of the sheet height, i.e., 0.5 sheet height–3 sheet heights. A height of via 165 (VBT), VBT_H, is equal to Nepi_H+ MD_H+Pepi_H+BMD_H+Isolation (MDLI). An aspect ratio of via 165 (VBT), VBT_H/W, ranges from five to ten, where W is a width of via 165' (VBT). A regular via aspect ratio, BVD_H/W or VD_H/W, ranges from one to three, where W is a width of via 163' (BVD) or via 121' (VD).

FIG. 2F illustrates a top view of a diagram of power tap cell 160, in accordance with some embodiments. The top view of power tap cell 160 is in a two-dimensional representation with x and y reference axes. As shown in FIG. 2F, a top view of power tap cell 160 between point A and point A' corresponding to the points A and A' in FIG. 2E is illustrated.

Integrated circuit 200 delivers power from the back side to the front side by a plurality of power tap cells. The usage of the power tap cells allows integrated circuit 200 to have continual metal lines, e.g., 140a, 140b, and 140c (FIG. 2A), to distribute a positive voltage level $V_{DD}$. The continual metal lines 140a, 140b, and 140c (BM0), i.e., continual power rails, simplify a power delivery network in integrated circuit 200. However, the high via resistance $R_C$ of the power tap cells may cause a high density of the power tap cells in integrated circuit 200. For example, as explained above with reference to FIG. 2B, the power tap cells are needed every two-cell height on the Y axis. Such a density of the power tap cells results in an area penalty to integrated circuit 200.

Figure 3A:
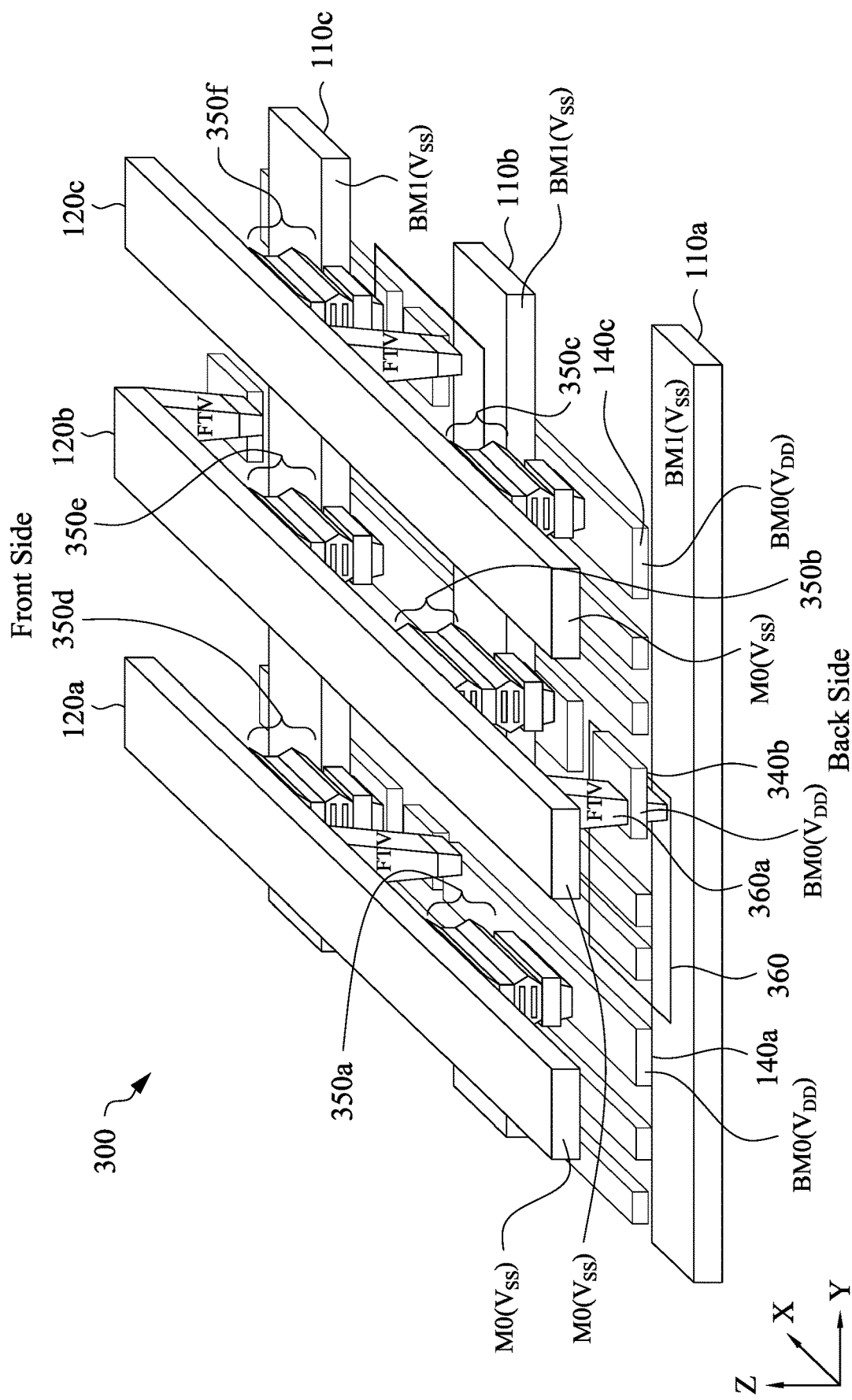
FIG. 3A illustrates a perspective view of a diagram of a third exemplary integrated circuit including power tap cells for power delivery, in accordance with some embodiments.

FIG. 3A illustrates a perspective view of a diagram of a third exemplary integrated circuit 300 including four power tap cells for power delivery, in accordance with some embodiments. The perspective view of the diagram of integrated circuit 300 is in a three-dimensional representation with x, y, and z reference axes. Integrated circuit 300 includes metal lines 110a, 110b, and 110c, metal lines 120a, 120b, and 120c, metal lines 140a, 340b, and 140c, CFETs 350a, 350b, 350c, 350d, 350e, and 350f, and a power tap cell 360 and other power tap cells. These CFETs and metal lines, except metal line 340b, have the same characteristics as their counterparts in integrated circuit 100 (FIG. 1). The power tap cells of integrated circuit 300 respectively include a feed-through via (FTV). For example, power tap cell 360 includes an FTV 360a coupled between metal line 110a at the back side and metal line 120b at the front side. FTV 360a is configured to deliver a negative voltage level (i.e., $V_{SS}$) from metal line 110a at the back side to metal line 120b at the front side. The back and front sides are on opposite sides of CFETs 350a, 350b, 350c, 350d, 350e, and 350f of integrated circuit 300.

In some embodiments, power tap cell 360 includes a super FTV (SFTV) (not shown) coupled between metal line 110a at the back side and metal line 120b at the front side. SFTV is configured to deliver a negative voltage level (i.e., VSS) from metal line 110a at the back side to metal line 120b at the front side.

Figure 3B:
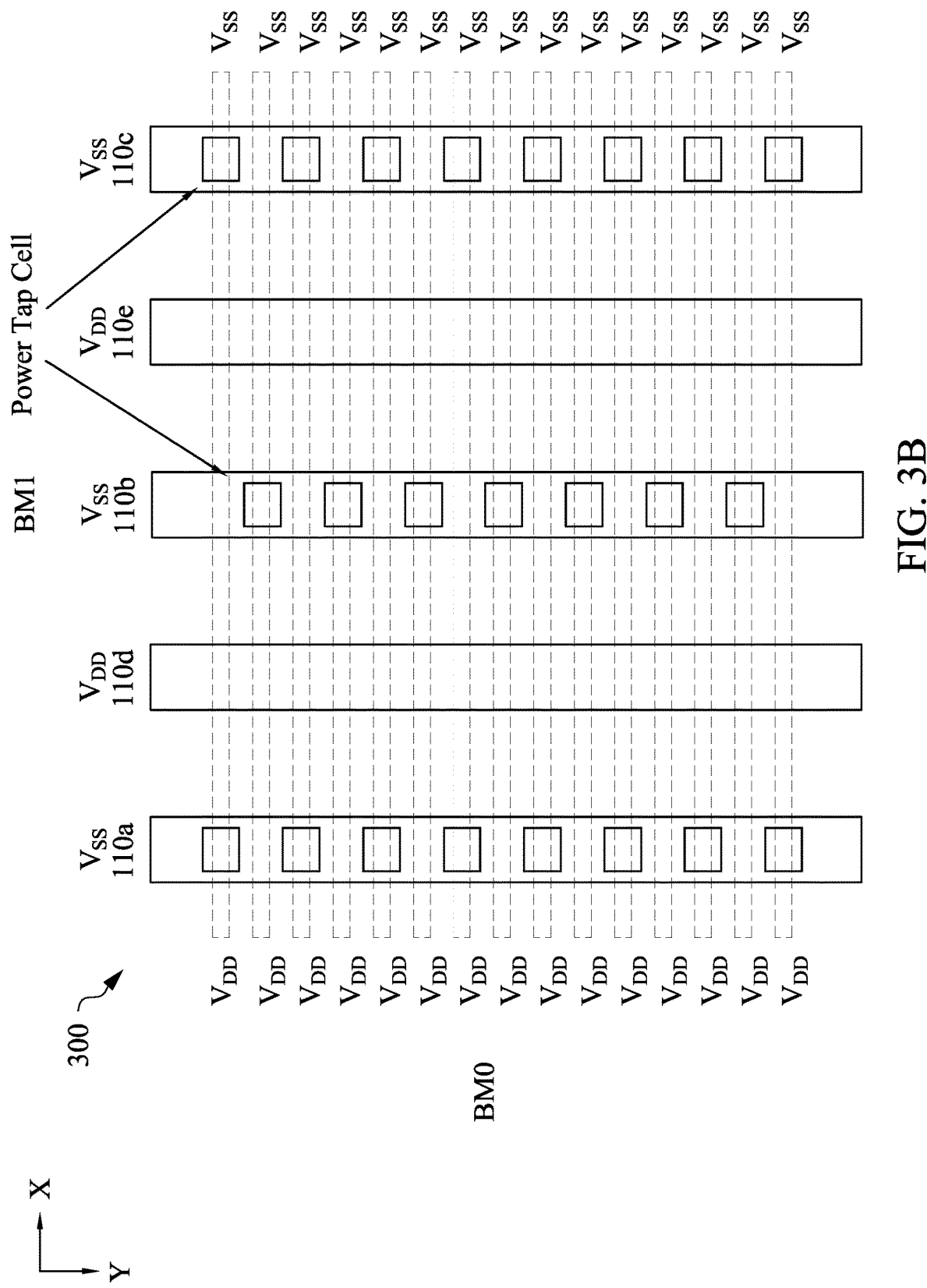
FIG. 3B illustrates a top view of a diagram of the third exemplary integrated circuit, in accordance with some embodiments.

FIG. 3B illustrates a top view of a diagram of integrated circuit 300, in accordance with some embodiments. The top view of the diagram of integrated circuit 300 is in a two-dimensional representation with x and y reference axes. Integrated circuit 300 includes metal lines 110a, 110b, 110c, 110d, and 110e in the second metal layer at the back side (i.e., BM1 in FIG. 3B). Metal lines 110a, 110b, and 110c are configured to provide a negative voltage level (i.e., VSS) at the back side. Metal lines 110e and 110d are configured to provide a positive voltage level (i.e., $V_{DD}$) at the back side. Integrated circuit 300 also includes a plurality of metal lines in the first metal layer at the back side (i.e., BM0 in FIG. 3B). The metal lines in the first metal layer at the back side (BM0) are configured to provide a positive voltage level (i.e., $V_{DD}$).

As illustrated in FIG. 3B, integrated circuit 300 includes a plurality of power tap cells configured to deliver the negative voltage level (i.e., $V_{SS}$) from metal lines 110a, 110b, and 110c in the second metal layer at the back side (BM1) to a plurality of metal lines in the first layer at the front side (i.e., M0 in FIG. 3A).

Figure 3C:
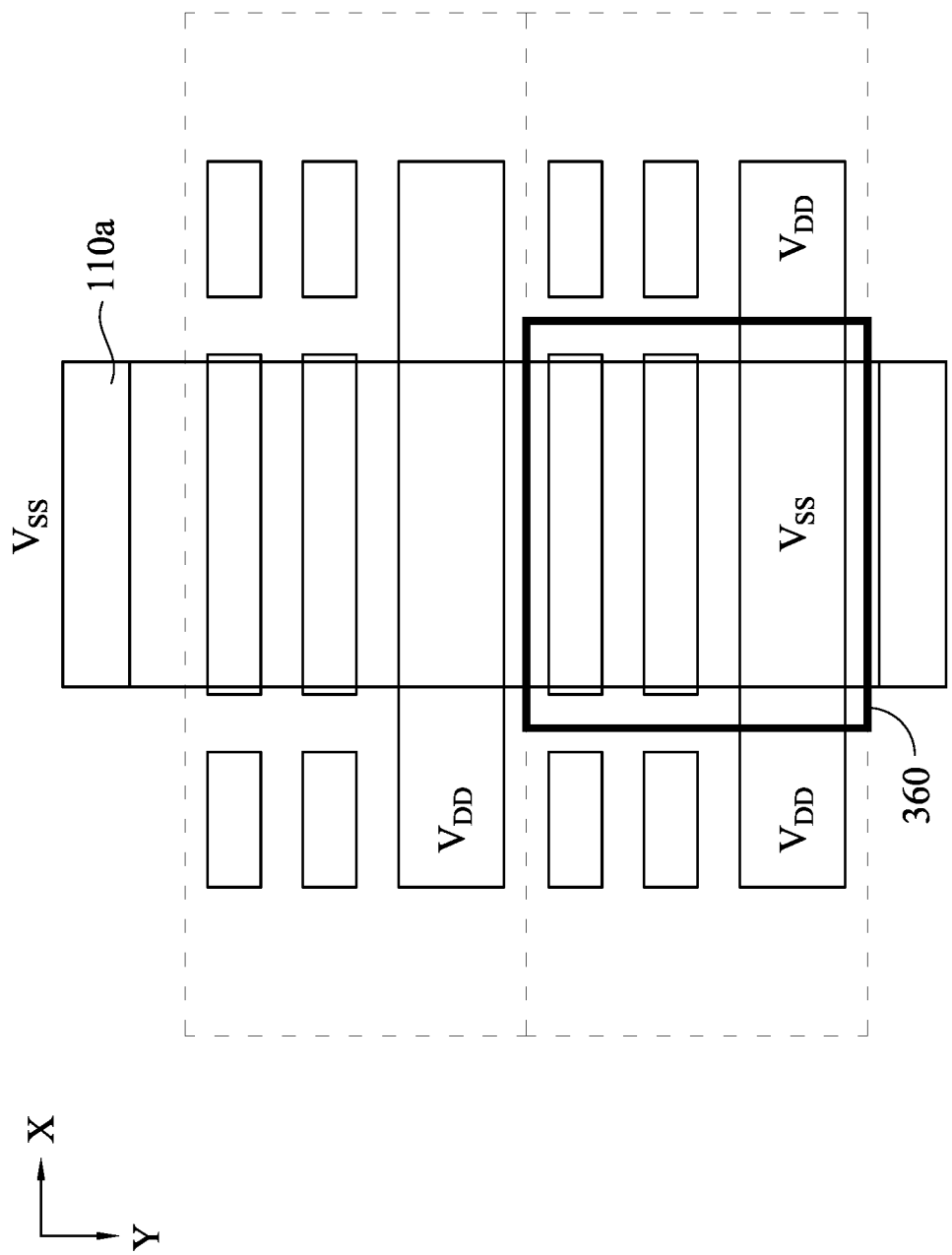
FIG. 3C illustrates a top view of a diagram of an exemplary power tap cell in the third exemplary integrated circuit, in accordance with some embodiments.

FIG. 3C illustrates a top view of a diagram of power tap cell 360 in integrated circuit 300, in accordance with some embodiments. The top view of the diagram of power tap cell 360 is in a two-dimensional representation with x and y reference axes. Power tap cell 360 is coupled to metal line 110a every two-cell height along the Y axis, as shown in FIGS. 3B and 3C.

Figure 3D:
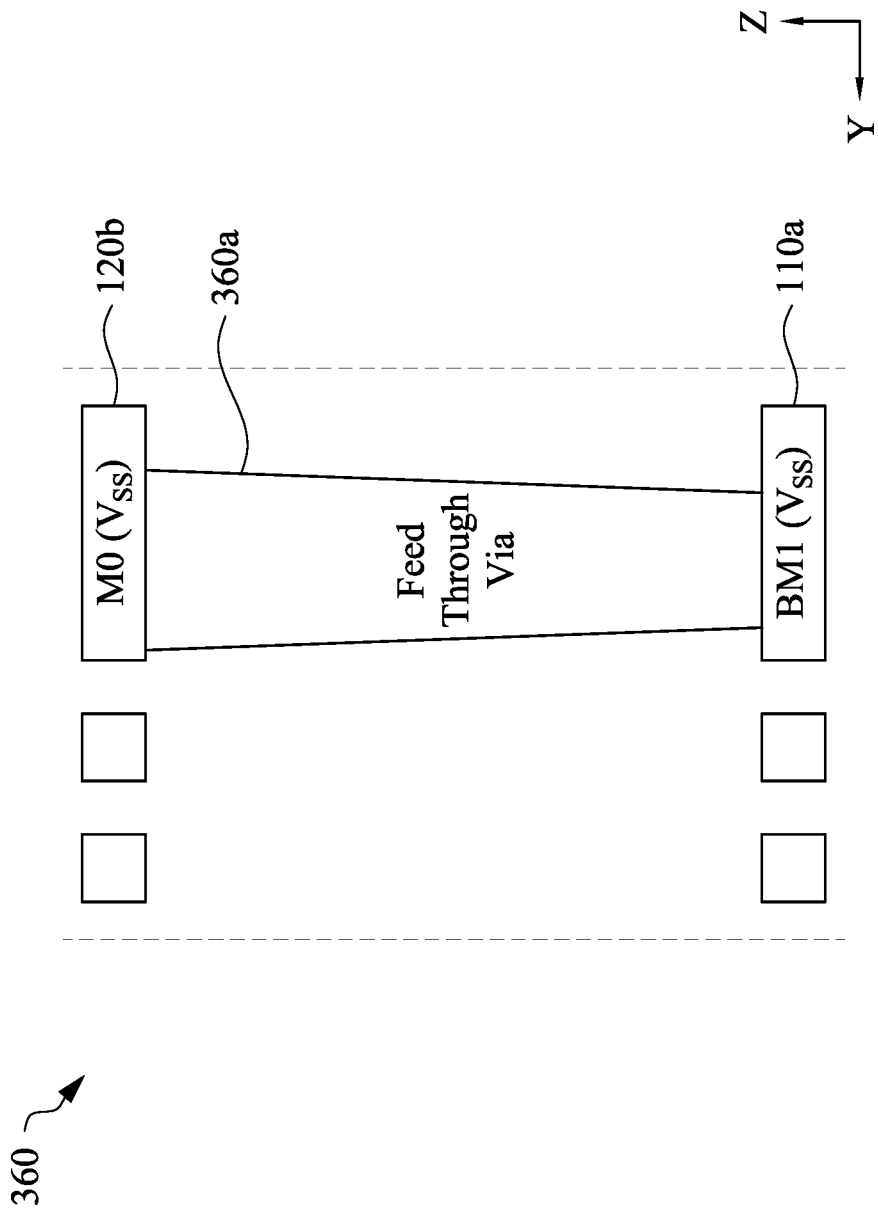
FIG. 3D illustrates a cross-sectional view of a diagram of the exemplary power tap cell in the third exemplary integrated circuit, in accordance with some embodiments.

FIG. 3D illustrates a cross-sectional view of a diagram of power tap cell 360 in integrated circuit 300, in accordance with some embodiments. The cross-sectional view of the diagram of power tap cell 360 is in a two-dimensional representation with y and z reference axes. Power tap cell 360 includes FTV 360a. FTV 360a is coupled between metal line 110a (BM1) at the back side and metal line 120b (M0) at the front side and configured to deliver the negative voltage level $V_{SS}$ from the back side to the front side.

Figure 3E:
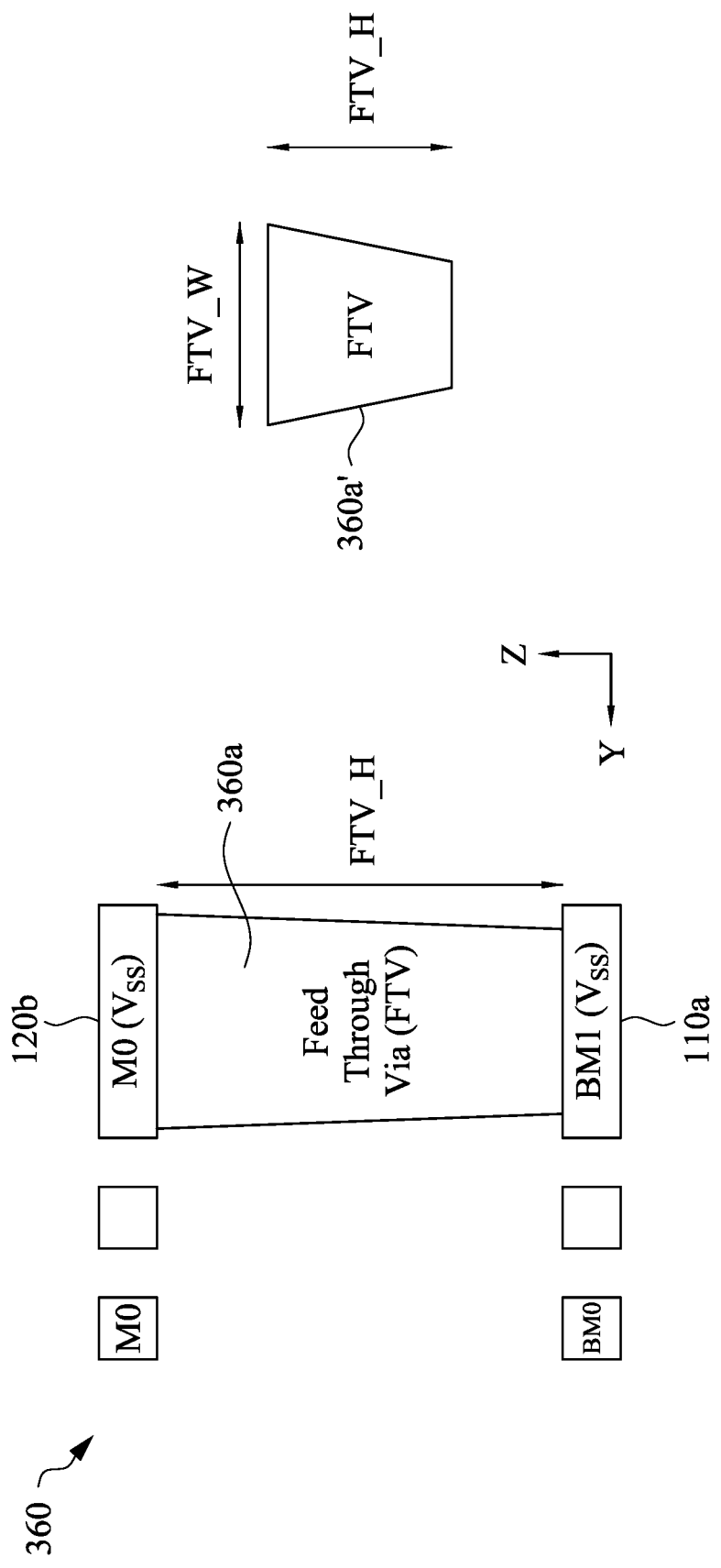
FIG. 3E illustrates exemplary geometry of the exemplary power tap cell in the third exemplary integrated circuit, in accordance with some embodiments.

FIG. 3E illustrates exemplary geometry of power tap cell 360 in integrated circuit 300, in accordance with some embodiments. The geometry of power tap cell 360 is in a two-dimensional representation with y and z reference axes. An aspect ratio of FTV 360a', FTV_H/FTV_W, ranges from one to three, where FTV_H is a height of FTV 360a' and FTV_W is a width of FTV 360a'.

Figure 3F:
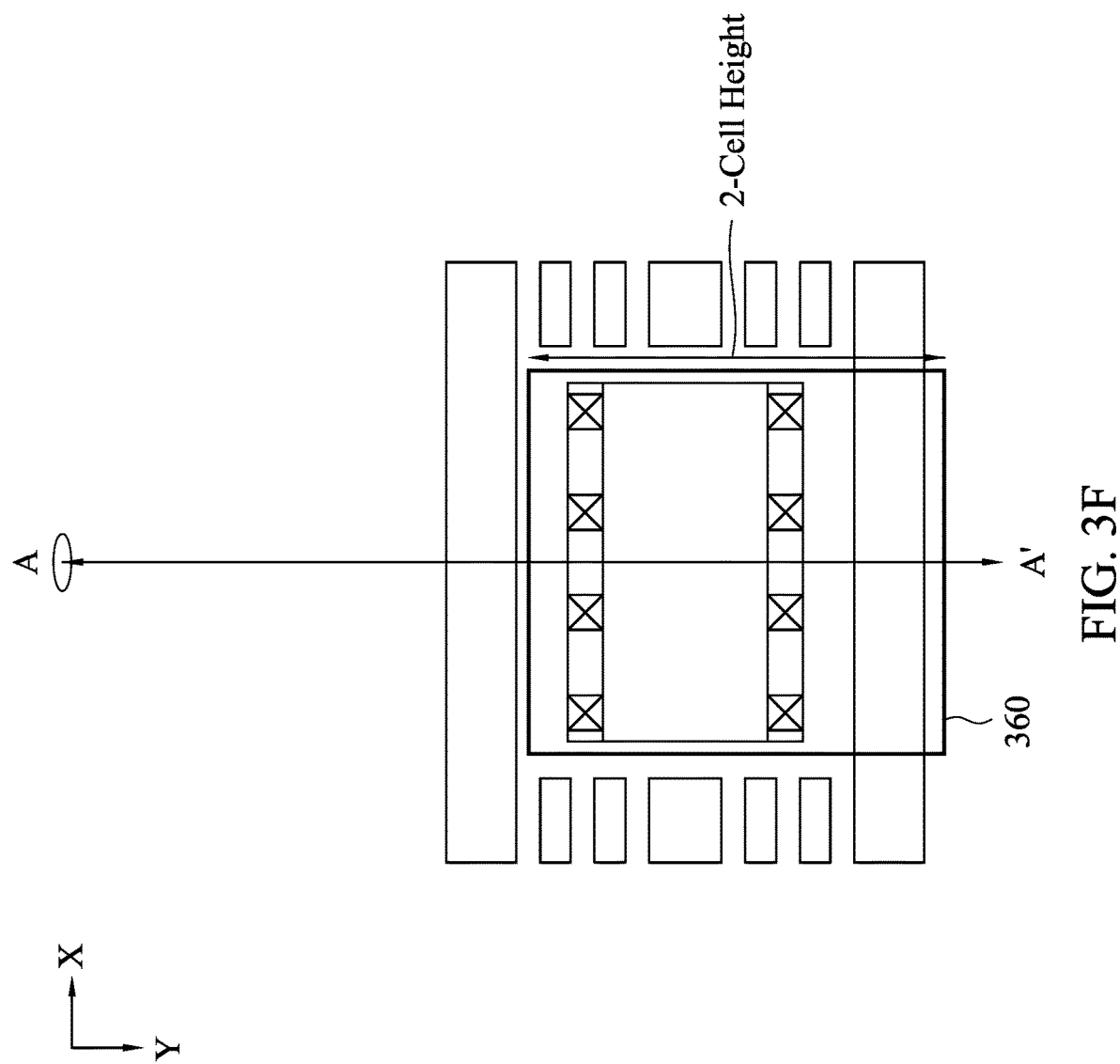
FIG. 3F illustrates a top view of a diagram of the exemplary power tap cell in the third exemplary integrated circuit, in accordance with some embodiments.

FIG. 3F illustrates a top view of a diagram of power tap cell 360 in integrated circuit 300, in accordance with some embodiments. The top view of power tap cell 360 is in a two-dimensional representation with x and y reference axes. As shown in FIG. 3F, a top view of power tap cell 360 between point A and point A' corresponding to the points A and A' in FIG. 3E illustrates that power tap cell 360 has an area of, for example, 2 cell heights×2 cell heights.

Integrated circuit 300 delivers power from the back side to the front side by a plurality of FTVs. The FTVs each have a lower via resistance $R_C$, as compared with resistances of the power tap cells in integrated circuit 200 (FIG. 2A). This may result in a lower density of the power tap cells in integrated circuit 300 and therefore a less area penalty. However, the FTVs require additional FTV processes during the manufacturing of integrated circuit 300. In addition, metal line 340b (i.e., BM0 ($V_{DD}$) in FIG. 3A) is not continual. Integrated circuit 300 requires additional metal lines to provide the positive voltage $V_{DD}$ on the back side.

Figure 4A:
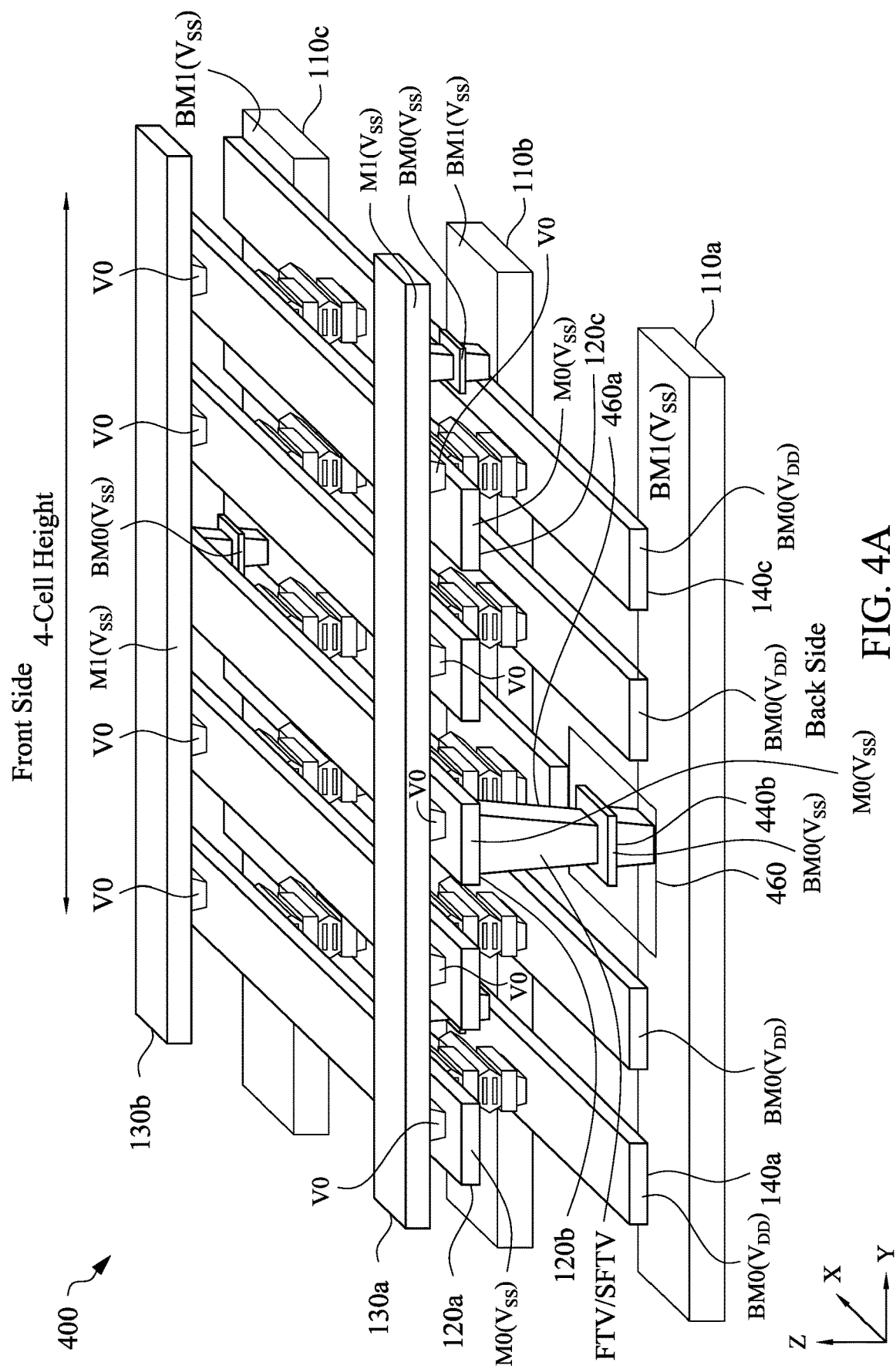
FIG. 4A illustrates a perspective view of a diagram of a fourth exemplary integrated circuit including power tap cells for power delivery, in accordance with some embodiments.

FIG. 4A illustrates a perspective view of a diagram of a fourth exemplary integrated circuit 400 including power tap cells for power delivery, in accordance with some embodiments. The perspective view of the diagram of integrated circuit 400 is in a three-dimensional representation with x, y, and z reference axes. Integrated circuit 400 includes metal lines 110a, 110b, and 110c, metal lines 120a, 120b, and 120c, metal lines 130a and 130b, metal lines 140a, 440b, and 140c, CFETs (not labelled), and a power tap cell 460 and other power tap cells (not labelled). These CFETs and metal lines, except metal lines 130a, 130b, and 440b, have the same characteristics as their counterparts in integrated circuit 100 (FIG. 1).

The power tap cells of integrated circuit 400 respectively include a feed-through via (FTV). For example, power tap cell 460 includes an FTV 460a coupled between metal line 110a at the back side and metal line 120b at the front side. As shown in FIG. 4A, FTV 460a is coupled to metal line 110a through metal line 440b (i.e., BM0($V_{SS}$) in FIG. 4A). FTV 460a is configured to deliver a negative voltage level (i.e., $V_{SS}$) from metal line 110a at the back side to metal line 440b and metal line 120b at the front side. The back and front sides are on opposite sides of the CFETs of integrated circuit 400.

In some embodiments, power tap cell 460 includes a super FTV (SFTV) (not shown) coupled between metal line 110a at the back side and metal line 130a (i.e., M1($V_{SS}$) in FIG. 4A) at the front side. SFTV is configured to deliver a negative voltage level (i.e., $V_{SS}$) from metal line 110a at the back side to metal line 130a at the front side. Metal line 130a is coupled to metal lines 120a, 120b, and 120c respectively through a via (i.e., V0 in FIG. 4A). The negative power level $V_{SS}$ is delivered from metal line 130a to metal lines 120a, 120b, and 120c. Metal lines 120a, 120b, and 120c are configured to deliver the negative power level $V_{SS}$ to CFETs if needed.

Figure 4B:
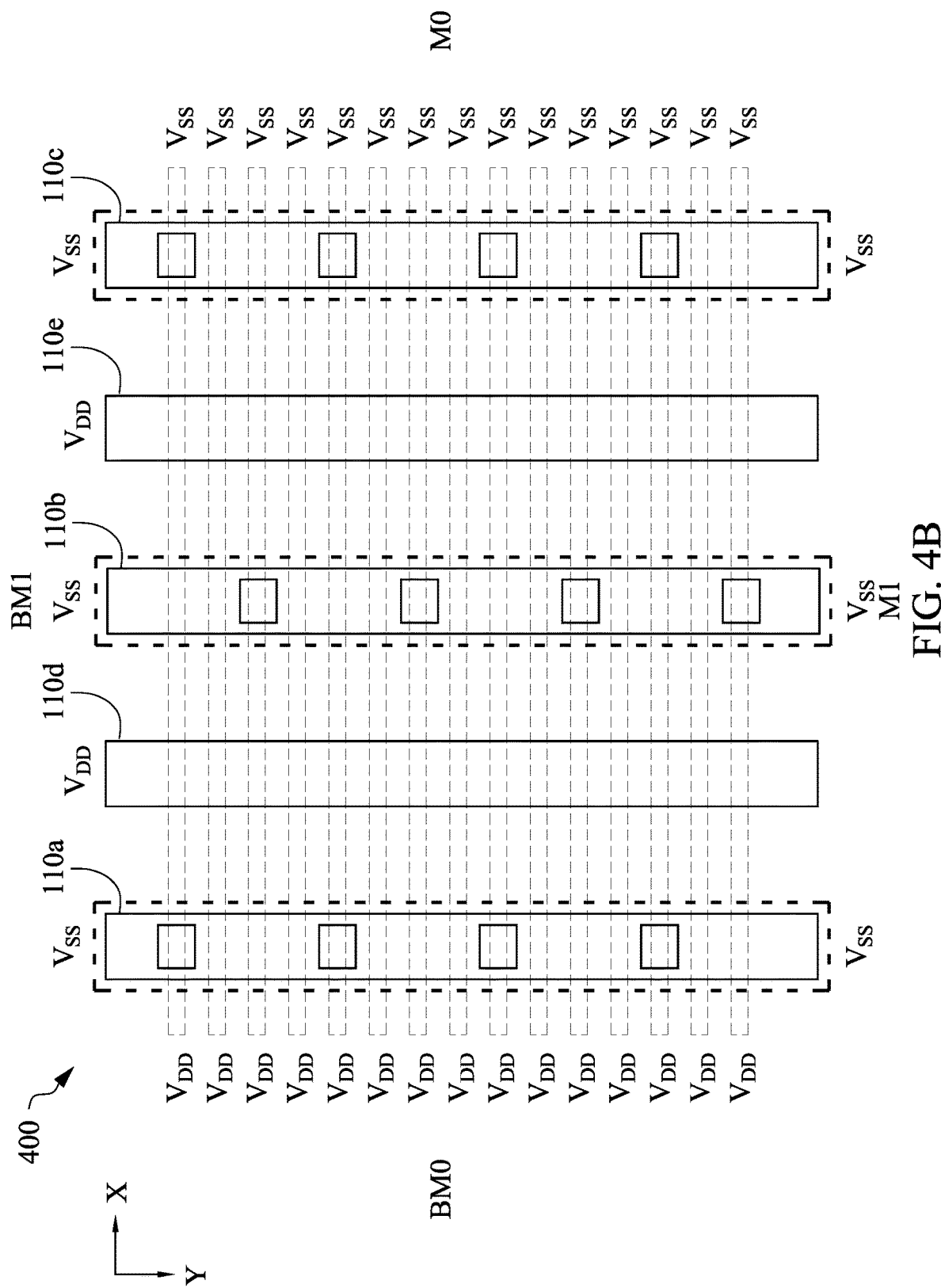
FIG. 4B illustrates a top view of a diagram of the fourth exemplary integrated circuit, in accordance with some embodiments.

FIG. 4B illustrates a top view of a diagram of integrated circuit 400, in accordance with some embodiments. The top view of the diagram of integrated circuit 400 is in a two-dimensional representation with x and y reference axes. Integrated circuit 400 includes metal lines 110a, 110b, 110c, 110d, and 110e in the second metal layer at the back side (i.e., BM1 in FIG. 4B). Metal lines 110a, 110b, and 110c are configured to provide a negative voltage level (i.e., VSS) at the back side. Metal lines 110e and 110d are configured to provide a positive voltage level (i.e., $V_{DD}$) at the back side. Integrated circuit 400 also includes a plurality of metal lines in the first metal layer at the back side (i.e., BM0 in FIG. 4B). The metal lines in the first metal layer at the back side (BM0) are configured to provide a positive voltage level (i.e., $V_{DD}$). Integrated circuit 400 also includes a plurality of metal lines in the first metal layer at the front side (i.e., M0 in FIG. 4B). The metal lines in the first metal layer at the front side (M0) are configured to provide a negative voltage level (i.e., $V_{SS}$).

As illustrated in FIG. 4B, integrated circuit 400 includes a plurality of power tap cells configured to deliver the negative voltage level (i.e., $V_{SS}$) from metal lines 110a, 110b, and 110c in the second metal layer at the back side (BM1) to a plurality of metal lines in the first layer at the front side (i.e., M0 in FIG. 4A). As compared with integrated circuit 300 (FIG. 3A), integrated circuit 400 includes fewer power tap cells because the FTVs in integrated circuit 400 each have a lower via resistance $R_C$. As shown in FIGS. 4A and 4B, integrated circuit 400 has a power tap cell every four cell heights. This density of the power tap cells is lower than that of integrated circuit 200 (FIG. 2A).

Figure 4C:
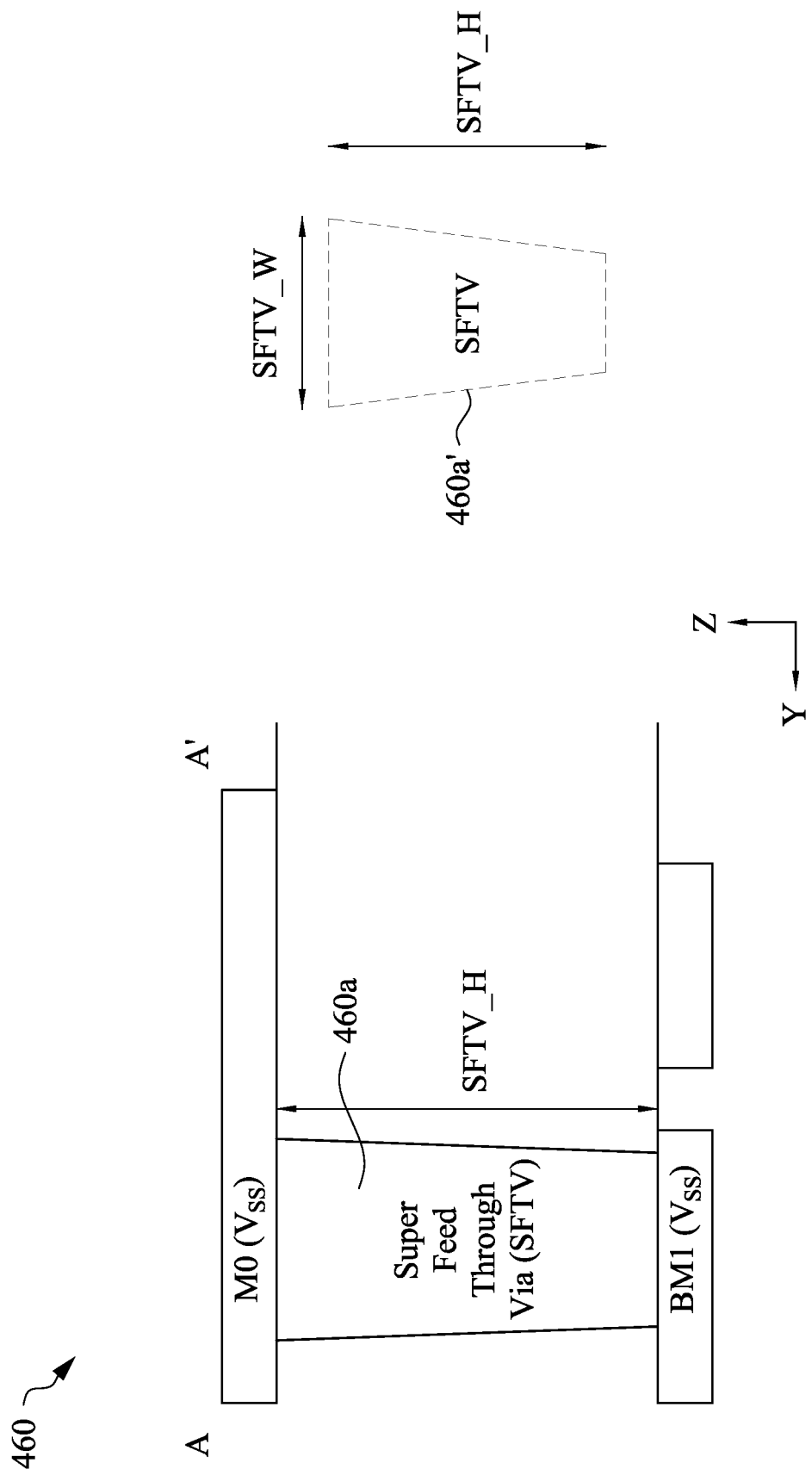
FIG. 4C illustrates exemplary geometry of an exemplary power tap cell in the fourth exemplary integrated circuit, in accordance with some embodiments.

FIG. 4C illustrates exemplary geometry of power tap cell 460 in integrated circuit 400, in accordance with some embodiments. The geometry of power tap cell 460 is in a two-dimensional representation with y and z reference axes. In the embodiments in which power tap cell 460 (FIG. 4A) includes a super FTV 460a (FIG. 4C), a regular via aspect ratio, SFTV_H/SFTV_W, ranges from one to three, where SFTV_H is a height of SFTV 460a' and SFTV_W is a width of SFTV 460a'.

Figure 5A:
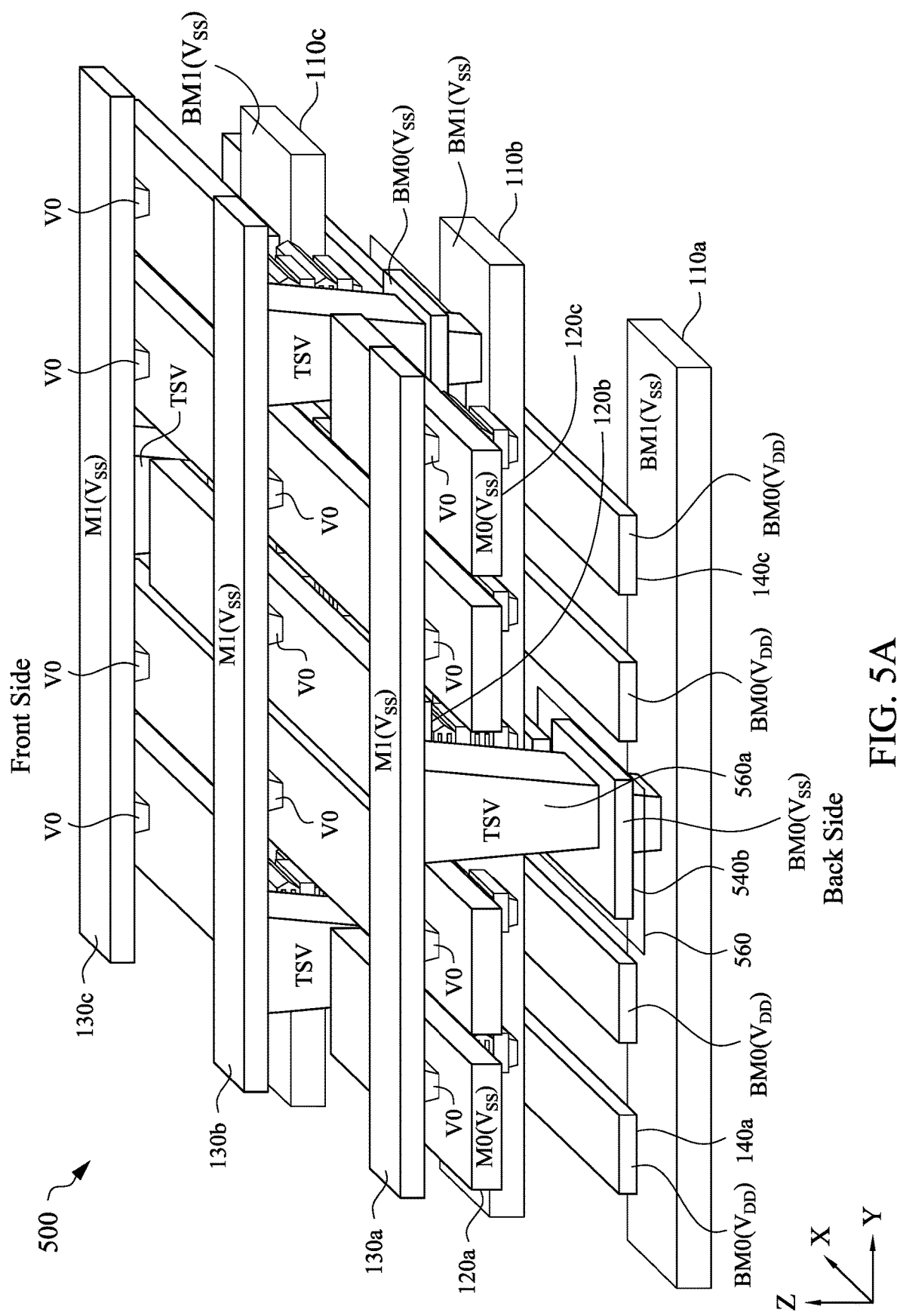
FIG. 5A illustrates a perspective view of a diagram of a fifth exemplary integrated circuit including power tap cells for power delivery, in accordance with some embodiments.

FIG. 5A illustrates a perspective view of a diagram of a fifth exemplary integrated circuit 500 including power tap cells for power delivery, in accordance with some embodiments. The perspective view of the diagram of integrated circuit 500 is in a three-dimensional representation with x, y, and z reference axes. Integrated circuit 500 includes metal lines 110a, 110b, and 110c, metal lines 120a, 120b, and 120c, metal lines 130a, 130b, and 130c, metal lines 140a, 540b, and 140c, CFETs (not labelled), and a power tap cell 560 and other power tap cells. These CFETs and metal lines, except metal line 540b, have the same characteristics as their counterparts in integrated circuit 400 (FIG. 4A).

The power tap cells of integrated circuit 500 respectively include a through-silicon via (TSV). For example, power tap cell 560 includes a TSV 560a coupled between metal line 110a at the back side and metal line 130a (i.e., M1($V_{SS}$) in FIG. 5A) at the front side. As shown in FIG. 5A, TSV 560a is coupled to metal line 110a through metal line 540b (i.e., BM0($V_{SS}$) in FIG. 5A). TSV 560a is configured to deliver a negative voltage level (i.e., $V_{SS}$) from metal line 110a at the back side to metal line 540b and metal line 130a at the front side. The back and front sides are on opposite sides of the CFETs of integrated circuit 500.

Metal line 130a is coupled to metal lines 120a and 120c respectively through a via (i.e., V0 in FIG. 5A). The negative power level $V_{SS}$ is delivered from metal line 130a to metal lines 120a and 120c. Likewise, the negative power level $V_{SS}$ is delivered from metal line 130b to metal line 120b. Metal lines 120a, 120b, and 120c are configured to deliver the negative power level $V_{SS}$ to CFETs if needed.

Figure 5B:
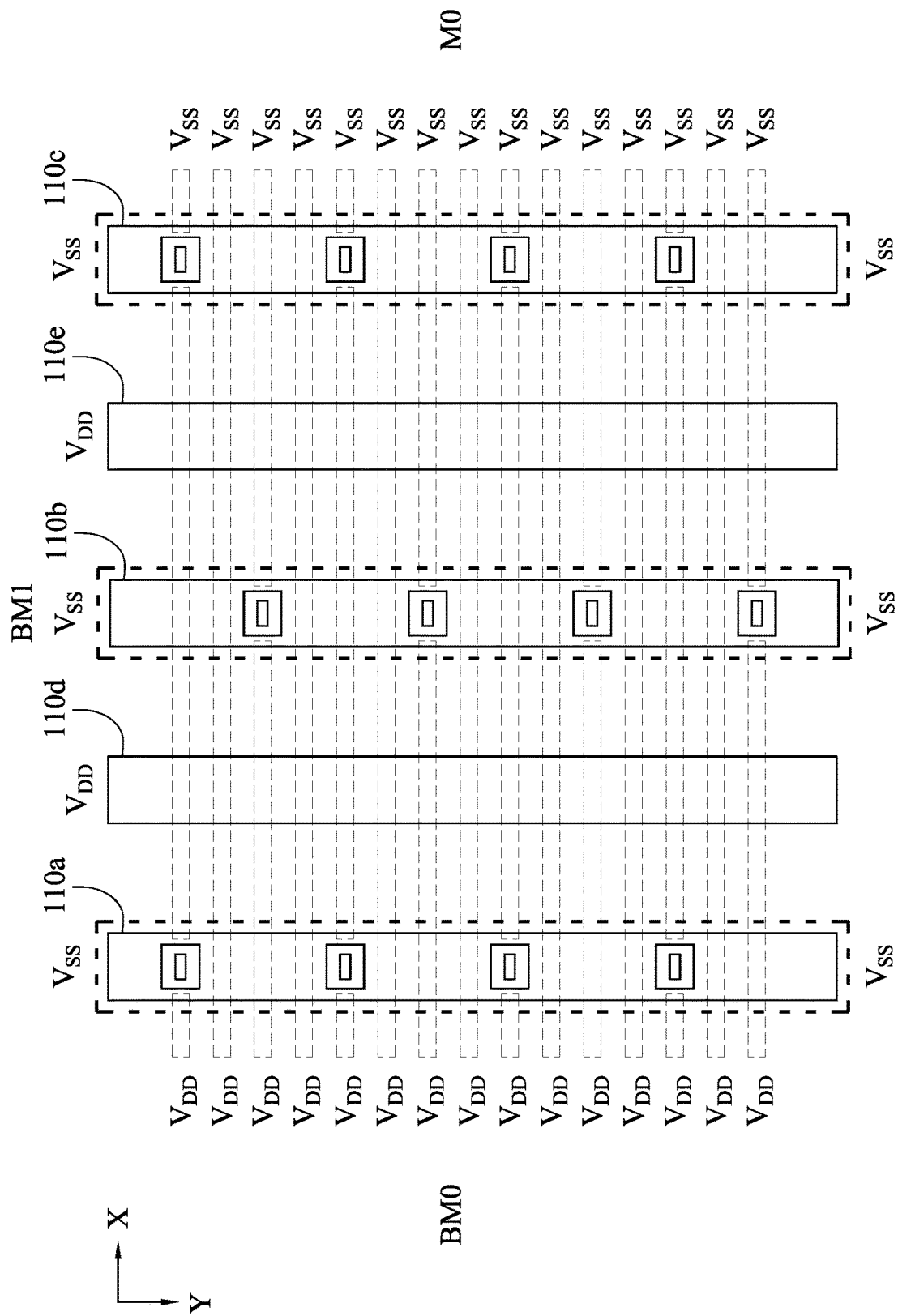
FIG. 5B illustrates a top view of a diagram of the fifth exemplary integrated circuit, in accordance with some embodiments.

FIG. 5B illustrates a top view of a diagram of integrated circuit 500, in accordance with some embodiments. The top view of the diagram of integrated circuit 500 is in a two-dimensional representation with x and y reference axes. Integrated circuit 500 includes metal lines 110a, 110b, 110c, 110d, and 110e in the second metal layer at the back side (i.e., BM1 in FIG. 5B). Metal lines 110a, 110b, and 110c are configured to provide a negative voltage level (i.e., VSS) at the back side. Metal lines 110e and 110d are configured to provide a positive voltage level (i.e., $V_{DD}$) at the back side. Integrated circuit 500 also includes a plurality of metal lines in the first metal layer at the back side (i.e., BM0 in FIG. 5B). The metal lines in the first metal layer at the back side (BM0) are configured to provide a positive voltage level (i.e., $V_{DD}$). Integrated circuit 500 also includes a plurality of metal lines in the first metal layer at the front side (i.e., M0 in FIG. 5B). The metal lines in the first metal layer at the front side (M0) are configured to provide a negative voltage level (i.e., $V_{SS}$).

As illustrated in FIG. 5B, integrated circuit 500 includes a plurality of power tap cells configured to deliver the negative voltage level (i.e., $V_{SS}$) from metal lines 110a, 110b, and 110c in the second metal layer at the back side (BM1) to a plurality of metal lines in the first layer at the front side (i.e., M0 in FIG. 5A). As compared with integrated circuit 300 (FIG. 3A), integrated circuit 400 includes fewer power tap cells. The reason is that TSVs have lower via resistance $R_C$. As shown in FIGS. 5A and 5B, integrated circuit 500 has a power tap cell every four cell heights. This density is lower than that of integrated circuit 200 (FIG. 2A).

Figure 5C:
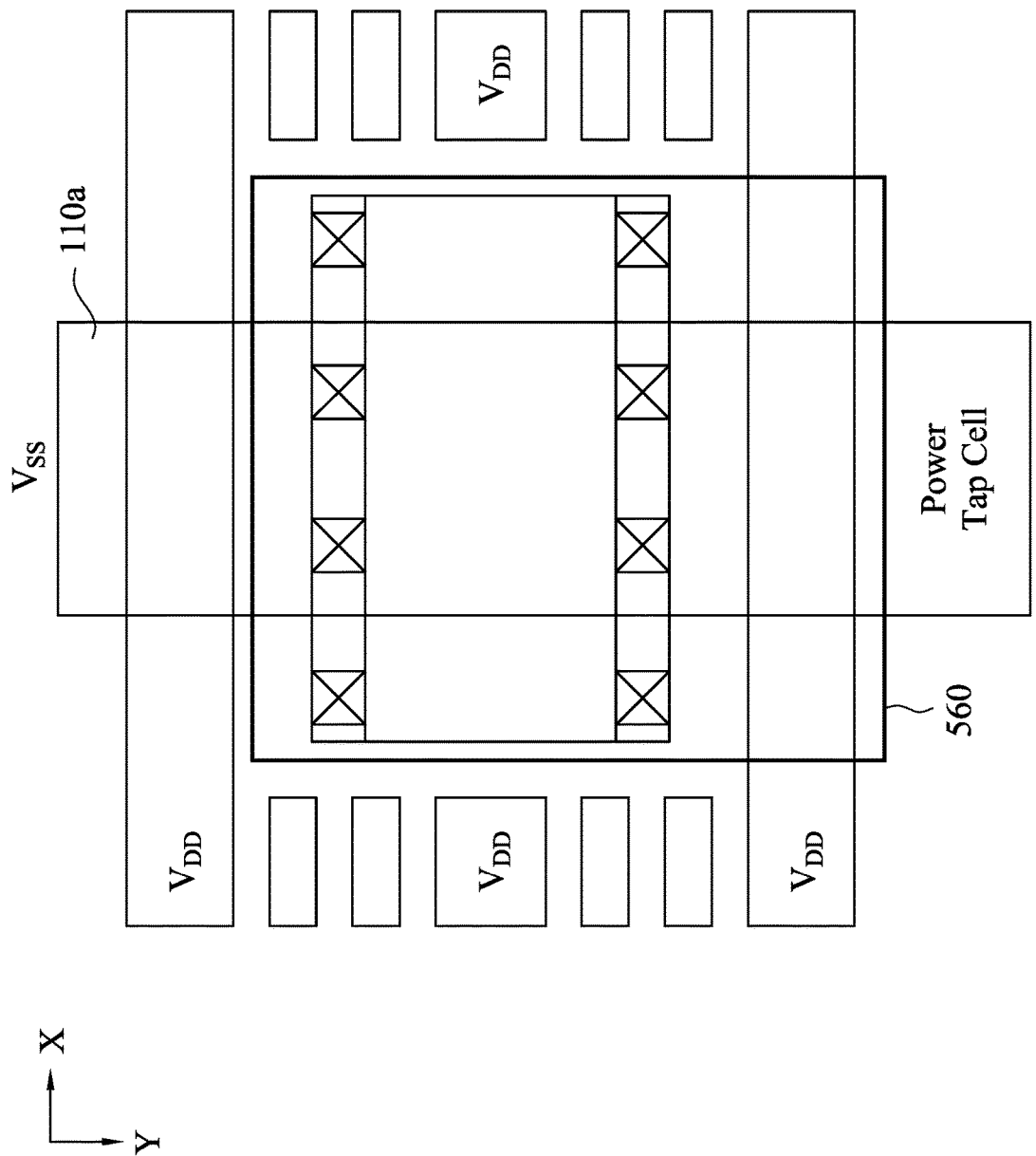
FIG. 5C illustrates a top view of a diagram of an exemplary power tap cell in the fifth exemplary integrated circuit, in accordance with some embodiments.

FIG. 5C illustrates a top view of a diagram of power tap cell 560 in integrated circuit 500, in accordance with some embodiments. The top view of the diagram of power tap cell 560 is in a two-dimensional representation with x and y reference axes. Power tap cell 560 is coupled to metal line 110a, as shown in FIG. 5C.

FIG. 6A illustrates a perspective view of a diagram of a sixth exemplary integrated circuit 600 including power tap cells for power delivery, in accordance with some embodiments. The perspective view of the diagram of integrated circuit 600 is in a three-dimensional representation with x, y, and z reference axes. Integrated circuit 600 includes metal lines 120a, 120b, and 120c, metal lines 140a, 640b, and 140c, metal lines 180a and 180c, metal lines 170a, 170b, and 170c, CFETs (not shown), and a power tap cell 660 and other power tap cells. These CFETs and metal lines of the same reference numbers have the same characteristics as their counterparts in integrated circuit 500 (FIG. 5A).

The power tap cells of integrated circuit 600 respectively include a TSV. For example, power tap cell 660 includes a TSV 660a coupled between metal line 640b (i.e., BM0($V_{SS}$) in FIG. 6A) at the back side and metal line 170a (i.e., M7($V_{SS}$) in FIG. 6A) at the front side. TSV 660a is configured to deliver a negative voltage level (i.e., $V_{SS}$) from metal line 640b (BM0) at the back side to metal line 170a at the front side. The back and front sides are on opposite sides of the CFETs of integrated circuit 600.

Metal line 170a is coupled to metal lines 180a and 180c (i.e., M6($V_{SS}$) in FIG. 6A) and other metal lines at the seventh metal layer (M6) respectively through a via (i.e., V6 in FIG. 6A). The negative power level $V_{SS}$ is delivered from metal line 170a to metal lines 180a and 180c. Likewise, the negative power level $V_{SS}$ is delivered from metal lines 170b and 170c to metal lines at M6. The metal lines at M6 are configured to deliver the negative power level $V_{SS}$ to CFETs if needed.

Figure 6B:
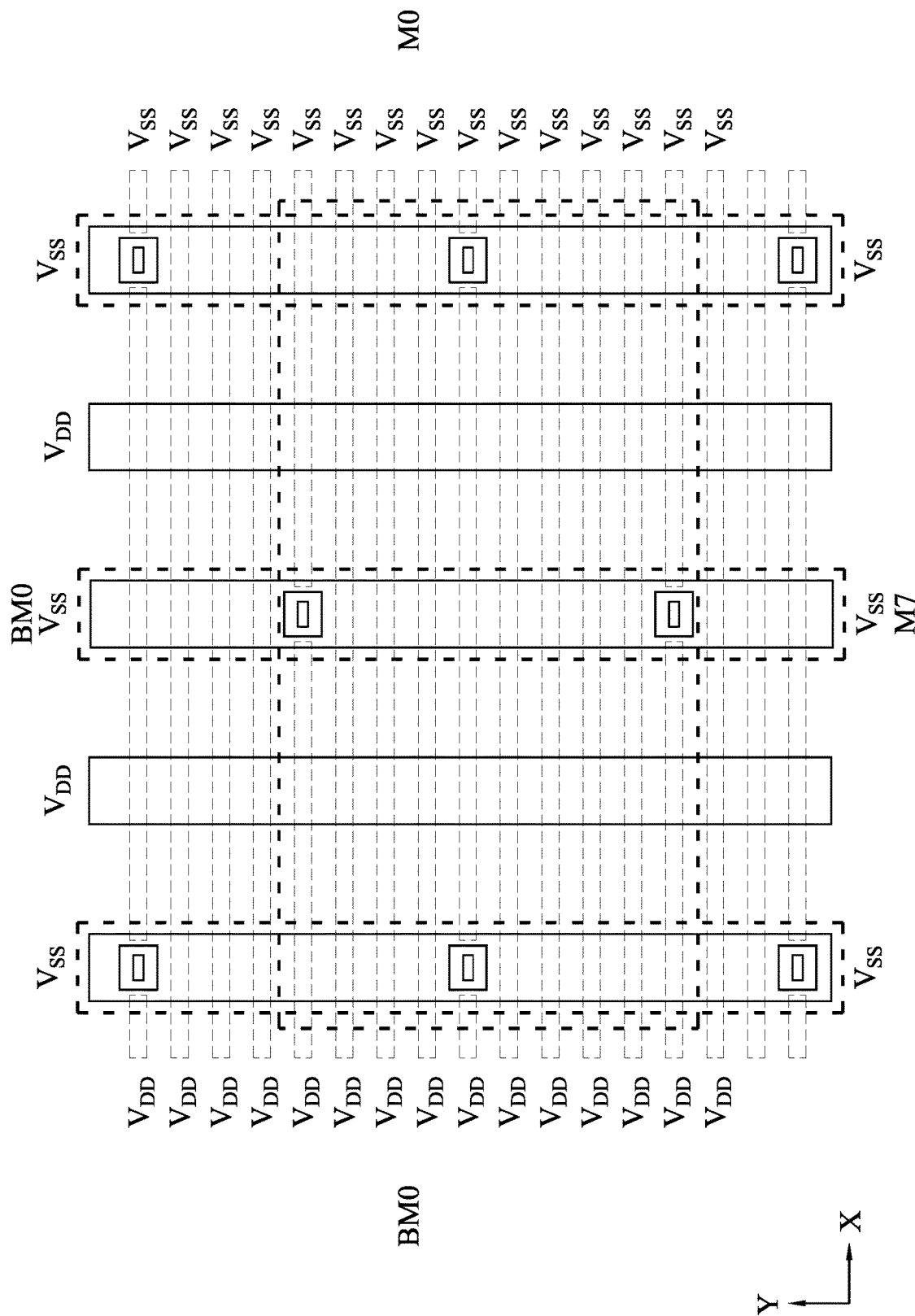
FIG. 6B illustrates a top view of a diagram of the sixth exemplary integrated circuit, in accordance with some embodiments.

FIG. 6B illustrates a top view of a diagram of integrated circuit 600, in accordance with some embodiments. The top view of the diagram of integrated circuit 600 is in a two-dimensional representation with x and y reference axes. Integrated circuit 600 includes a plurality of metal lines in the first metal layer at the back side (i.e., BM0 in FIG. 6B). These metal lines are configured to provide a negative voltage level (i.e., VSS) at the back side. Some other metal lines are configured to provide a positive voltage level (i.e., $V_{DD}$) at the back side. Integrated circuit 600 also includes a plurality of metal lines in the first metal layer at the back side (i.e., BM0 in FIG. 6B). The metal lines in the first metal layer at the back side (BM0) are configured to provide a positive voltage level (i.e., $V_{DD}$). Integrated circuit 600 also includes a plurality of metal lines in the eighth metal layer at the front side (i.e., M7 in FIG. 6B). The metal lines in the first metal layer at the front side (M7) are configured to provide a negative voltage level (i.e., $V_{SS}$).

Figure 6C:
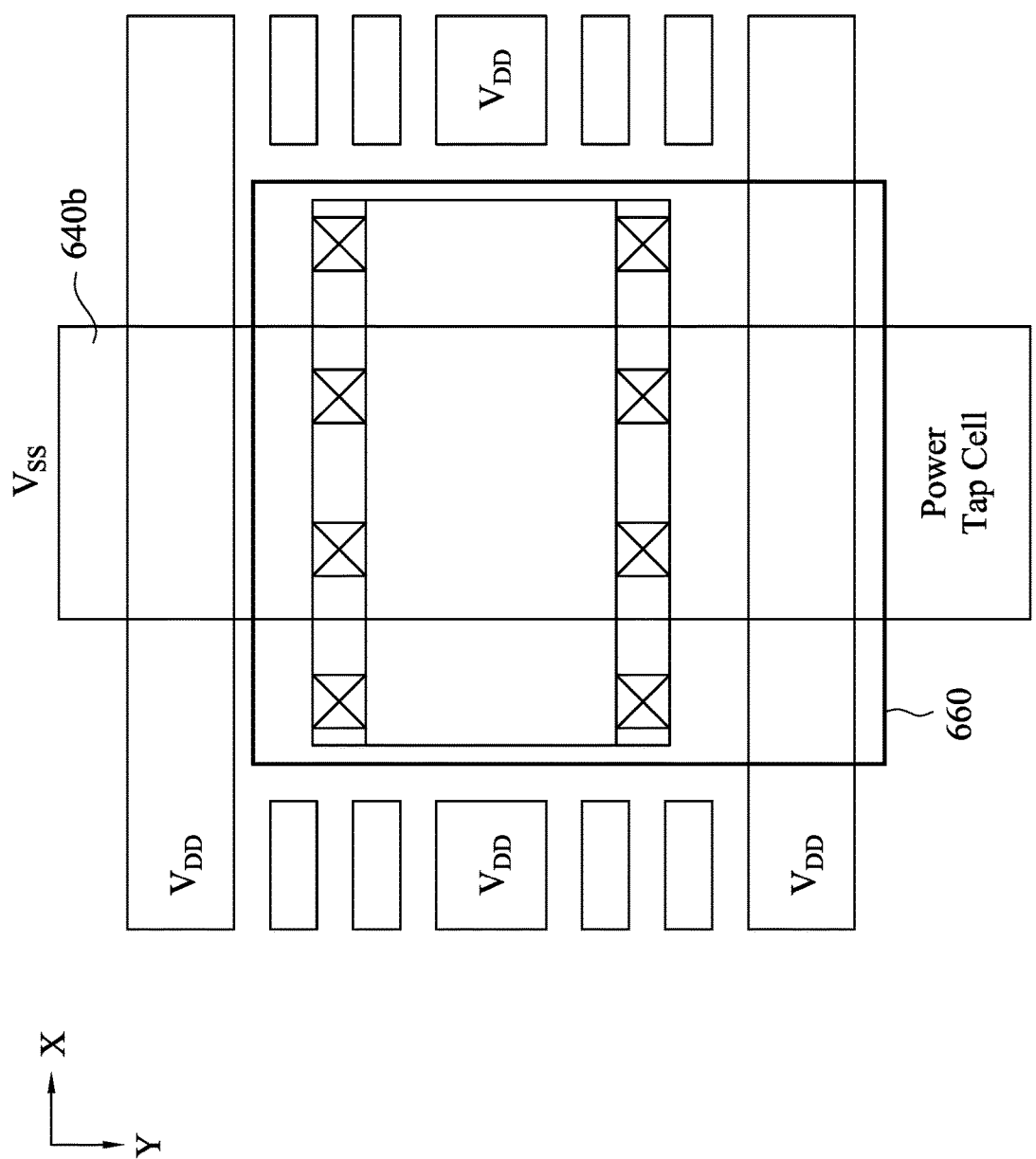
FIG. 6C illustrates a top view of a diagram of an exemplary power tap cell in the sixth exemplary integrated circuit, in accordance with some embodiments.

FIG. 6C illustrates a top view of a diagram of power tap cell 660 in integrated circuit 600, in accordance with some embodiments. The top view of the diagram of power tap cell 660 is in a two-dimensional representation with x and y reference axes. Power tap cell 660 is coupled to metal line 640b, as shown in FIG. 6C.

Integrated circuit 600 delivers power from the back side to the front side by a plurality of TSVs. The TSVs have lower via resistance $R_C$, as compared with that of the power tap cells in integrated circuit 200 (FIG. 2A). This may result in a lower density of the power tap cells in integrated circuit 600 and therefore a less area penalty. However, the TSVs require additional TSV processes when manufacturing integrated circuit 600. In addition, it is also necessary to follow TSV keep-out rules when manufacturing integrated circuit 600.

Figure 7A:
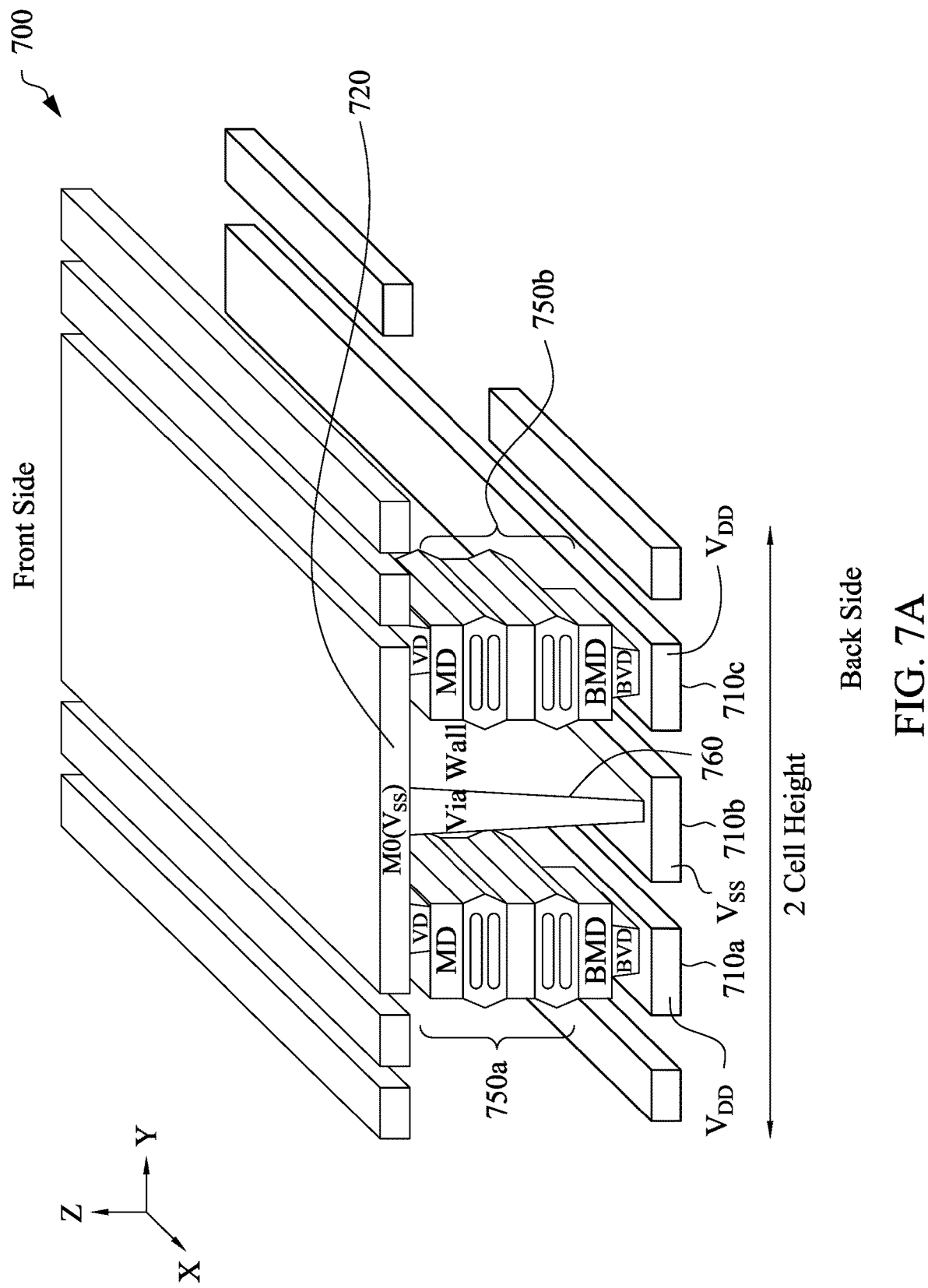
FIG. 7A illustrates a perspective view of a diagram of a seventh exemplary integrated circuit including a via wall for power delivery, in accordance with some embodiments.

FIG. 7A illustrates a perspective view of a diagram of a seventh exemplary integrated circuit 700 including a via wall for power delivery, in accordance with some embodiments. The perspective view of the diagram of integrated circuit 700 is in a three-dimensional representation with x, y, and z reference axes. Integrated circuit 700 includes metal lines 710a, 710b, and 710c, a metal line 720, CFETs 750a and 750b, and a via wall 760. Metal lines 710a and 710c are configured to deliver a positive voltage level $V_{DD}$ at the back side. Metal line 710b is configured to deliver a negative voltage level $V_{SS}$ at the back side. Via wall 760 is configured to deliver the negative power level $V_{SS}$ from the metal line 710b at the back side to metal line 720 at the front side. Metal line 720 is configured to deliver the negative power level $V_{SS}$ to CFETs 750a and 750b if needed. The back and front sides are on opposite sides of CFETs 750a and 750b of integrated circuit 700.

Figure 7B:
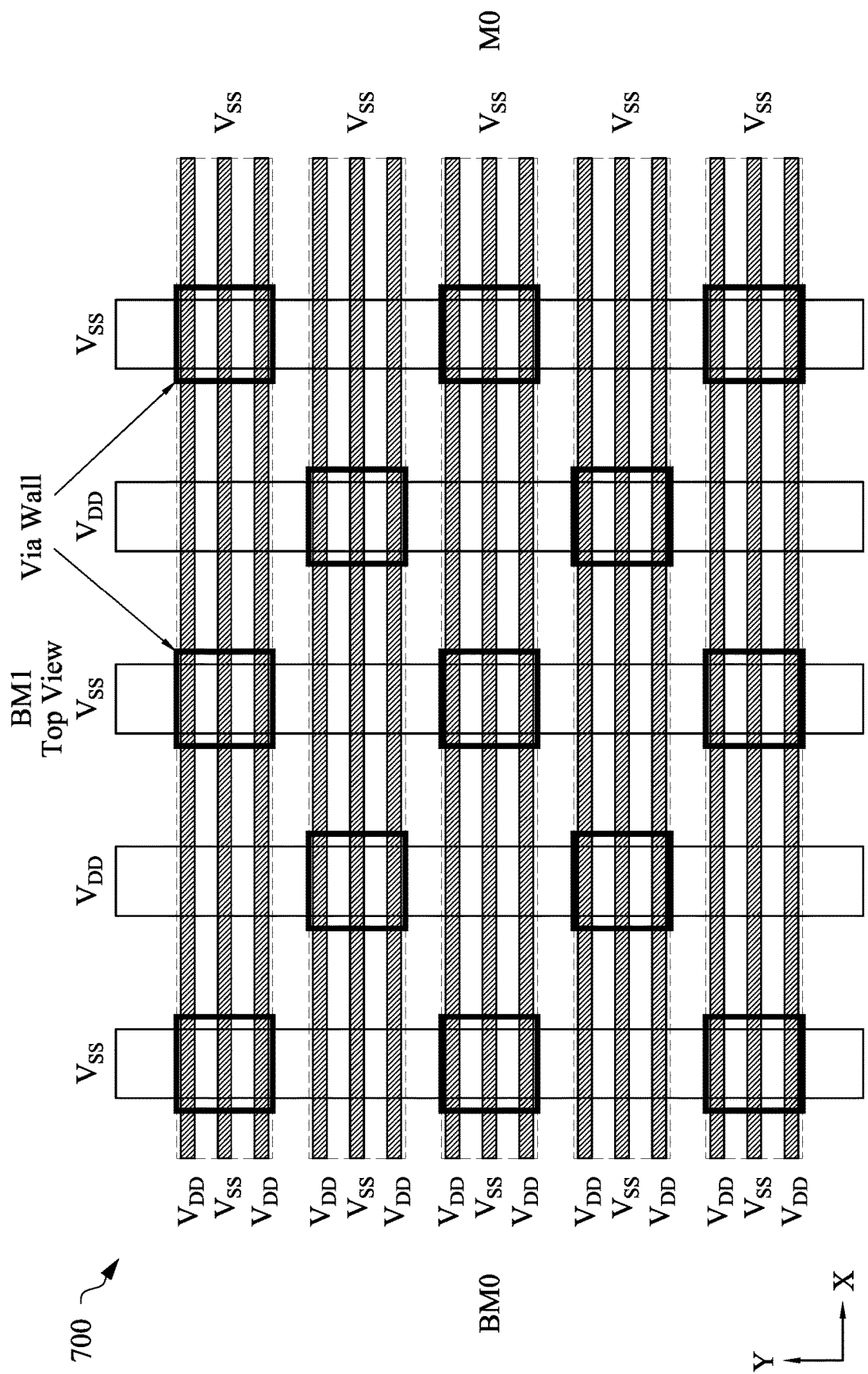
FIG. 7B illustrates a top view of a diagram of the seventh exemplary integrated circuit, in accordance with some embodiments.

FIG. 7B illustrates a top view of a diagram of integrated circuit 700, in accordance with some embodiments. The top view of the diagram of integrated circuit 700 is in a two-dimensional representation with x and y reference axes. Integrated circuit 700 includes a plurality of via walls configured to deliver power from the back side to the front side.

Integrated circuit 700 delivers power from the back side to the front side by a plurality of via walls. The usage of the via walls allows integrated circuit 700 to deliver power without power tap cells. This avoids an area penalty in integrated circuit 700. However, the via walls requires additional via wall processes during the manufacturing of integrated circuit 700. Also, the height of the via walls needs to be higher than that of vias in other circuits.

Figure 8:
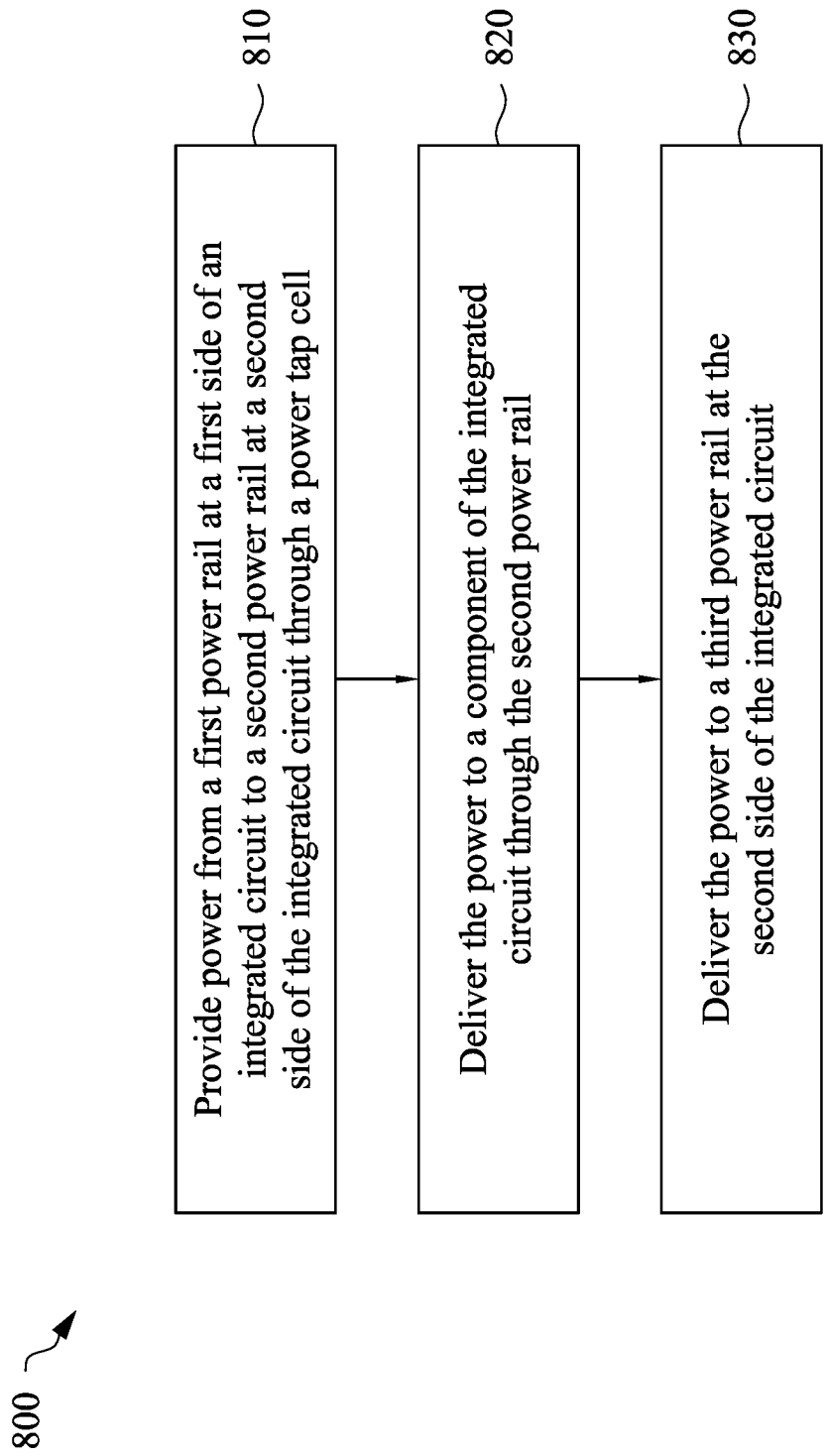
FIG. 8 is a flowchart of an exemplary method for power delivery, in accordance with some embodiments.

FIG. 8 is a flowchart of an exemplary method 800 for power delivery, in accordance with some embodiments. Method 800 may be practiced by all integrated circuits disclosed and illustrated in the present disclosure. Method 800 includes providing power from a first power rail at a first side of an integrated circuit to a second power rail at a second side of the integrated circuit through a power tap cell (step 810); delivering the power to a component of the integrated circuit through the second power rail (step 820); and delivering the power to a third power rail at the second side of the integrated circuit (step 830).

Step 810 includes providing power from a first power rail at a first side of an integrated circuit to a second power rail at a second side of the integrated circuit through a power tap cell. For example, as shown in FIG. 2A, integrated circuit 200 is configured to provide the negative power level $V_{SS}$ from metal line 110a at the back side of integrated circuit 200 to metal line 120b at the front side of integrated circuit 200 through power tap cell 160.

Step 820 includes delivering the power to a component of the integrated circuit through the second power rail. For example, as shown in FIG. 1, metal line 120b is configured to deliver the negative power level $V_{SS}$ to CFET 150e.

Step 830 includes delivering the power to a third power rail at the second side of the integrated circuit. For example, as shown in FIG. 5A, integrated circuit 200 is configured to deliver the negative power level $V_{SS}$ from metal line 130a (M1($V_{SS}$)) to metal line 120a (M0($V_{SS}$)) through a via (V0) at the front side of the integrated circuit.

Figure 9:
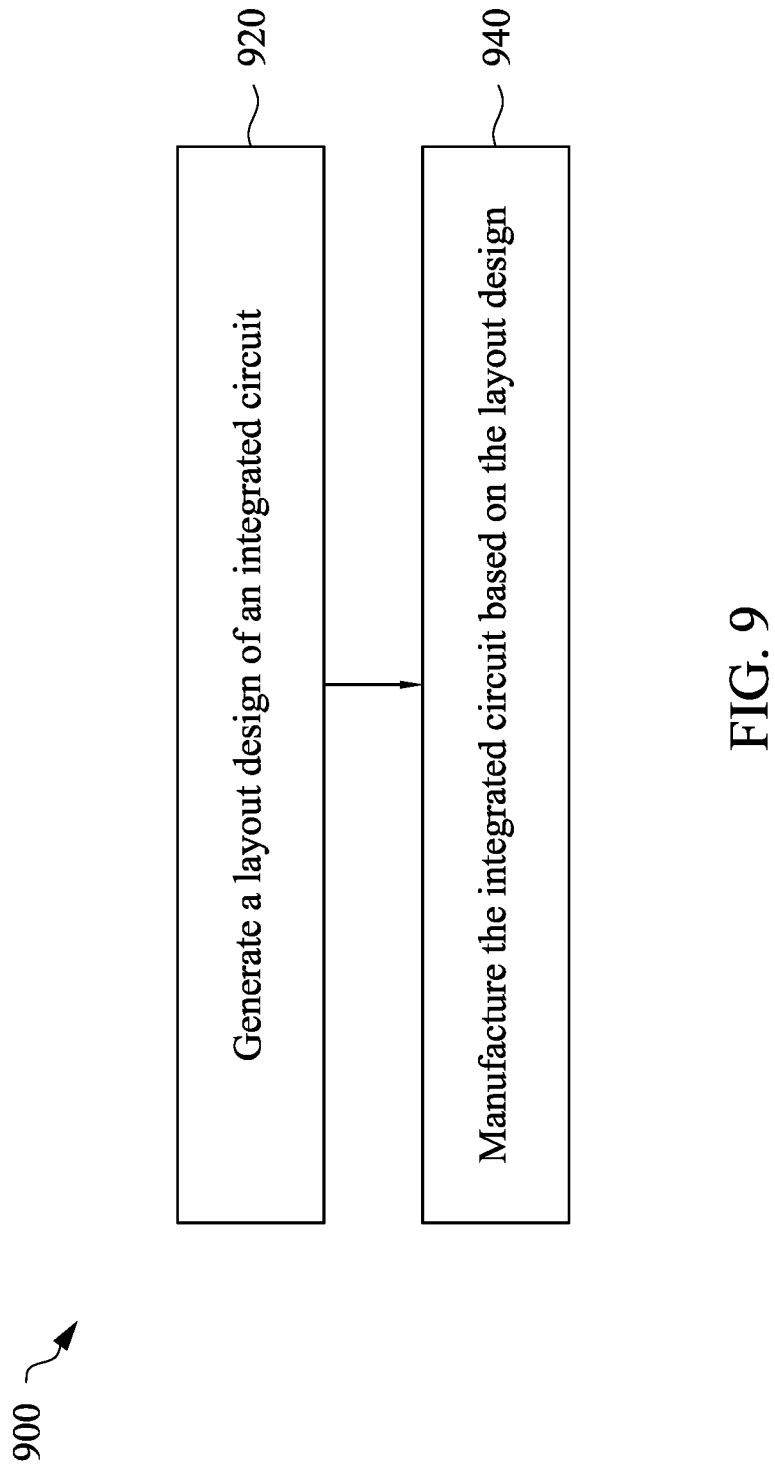
FIG. 9 is a flowchart of an exemplary method for forming and manufacturing an integrated circuit, in accordance with some embodiments.

FIG. 9 is a flowchart of an exemplary method 900 of forming and manufacturing an integrated circuit, in accordance with some embodiments. Method 900 includes generating an integrated circuit layout (step 920); and manufacturing an integrated circuit based on the integrated circuit layout (step 940). Some other steps may be briefly described herein. Additional steps may be performed before, during, and/or after method 900 for forming or manufacturing an integrated circuit. Method 900 may be used to form and manufacture integrated circuits 100 (FIG. 1), 200 (FIGS. 2A-2F), 300 (FIGS. 3A-3F), 400 (FIGS. 4A-4C), 500 (FIGS. 5A-5C), 600 (FIGS. 6A-6C), and/or 700 (FIGS. 7A and 7B).

Step 920 includes generating an integrated circuit layout. For example, a processor of a computer system may be configured to execute instructions stored in a memory of the computer system to generate an integrated circuit layout for integrated circuits 100, 200, 300, 400, 500, 600, or 700. In some embodiments, the integrated circuit layout in step 920 is in a graphic database system file format, such as a graphic database system II (GDSII) file format.

Step 940 includes manufacturing an integrated circuit based on the layout design. For example, semiconductor manufacturing equipment may be configured to manufacture integrated circuits 100, 200, 300, 400, 500, 600, or 700 based on the integrated circuit layout in step 920.

In some embodiments, method 900 may also include manufacturing at least one mask based on the integrated circuit layout in step 920. Manufacturing an integrated circuit of step 940 includes manufacturing the integrated circuit based on the at least one mask. For example, photomask equipment may be configured to manufacture one or more masks based on the integrated circuit layout of integrated circuits 100, 200, 300, 400, 500, 600, or 700. Semiconductor manufacturing equipment is configured to manufacture integrated circuits 100, 200, 300, 400, 500, 600, or 700 based on the one or more masks.

Figure 10:
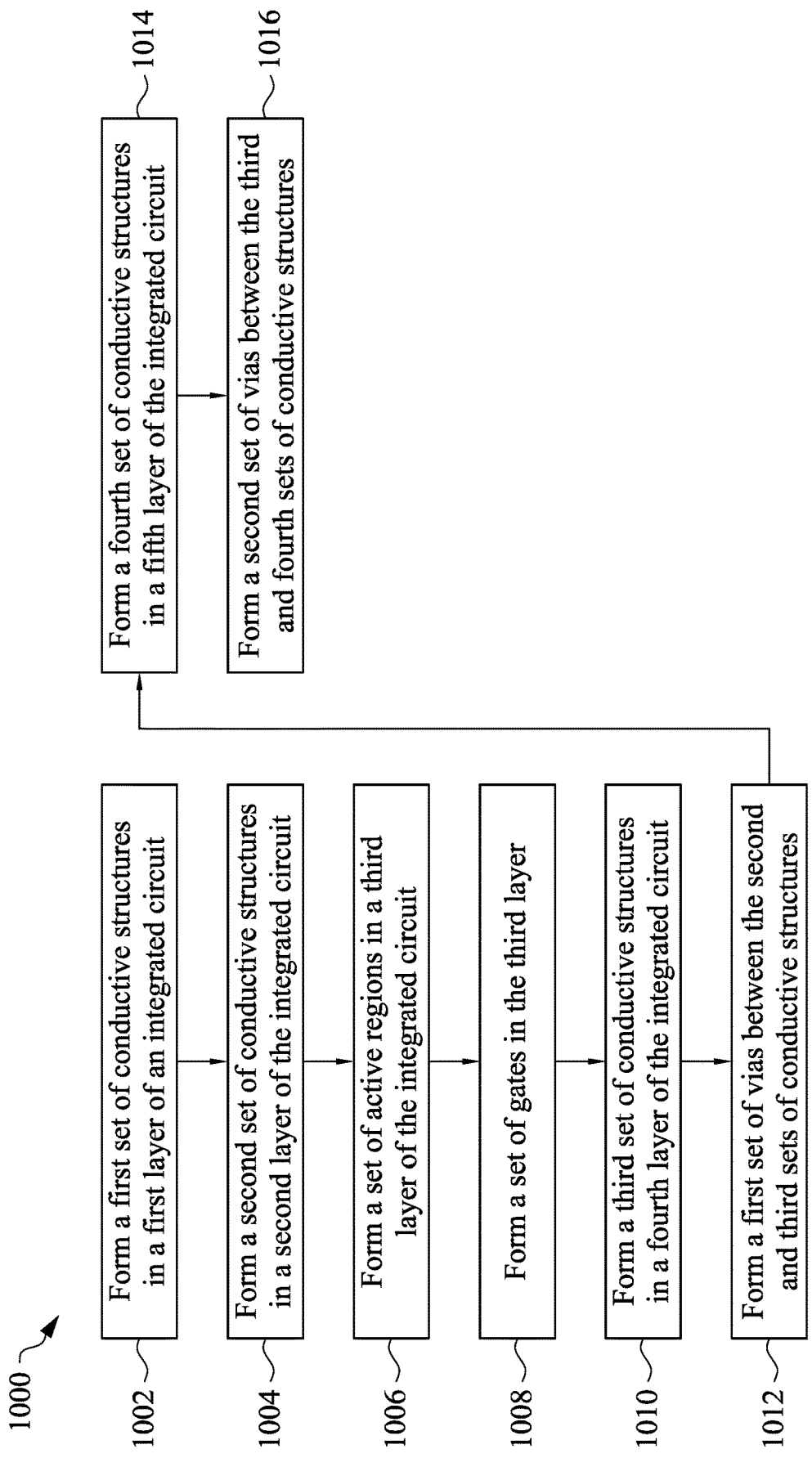
FIG. 10 is a flowchart of an exemplary method for fabricating an integrated circuit, in accordance with some embodiments.

FIG. 10 is a flowchart of an exemplary method 1000 for fabricating an integrated circuit, in accordance with some embodiments. Method 1000 includes forming a first set of conductive structures in a first layer of the integrated circuit (step 1002); forming a second set of conductive structures in a second layer of the integrated circuit (step 1004); forming a set of active regions in a third layer of the integrated circuit (step 1006); forming a set of gates in the third layer (step 1008); forming a third set of conductive structures in a fourth layer of the integrated circuit (step 1010); forming a first set of vias between the second and third sets of conductive structures (step 1012); forming a fourth set of conductive structures in a fifth layer of the integrated circuit (step 1014); and forming a second set of vias between the third and fourth sets of conductive structures (step 1016).

Step 1002 includes forming a first set of conductive structures in a first layer of the integrated circuit. For example, semiconductor manufacturing equipment forms a plurality of metal lines, including metal lines 140a, 140b, and 140c (FIG. 1), in the first metal layer at the back side (i.e., BM0) of integrated circuit 100. The plurality of metal lines, including metal lines 140a, 140b, and 140c, are formed in a direction of X axis and are separate from each other in a direction of Y axis, which is different from the direction of X axis.

Step 1004 includes forming a second set of conductive structures in a second layer of the integrated circuit. For example, the semiconductor manufacturing equipment forms a plurality of metal lines, including metal lines 110a, 110b, and 110c (FIG. 1), in the second metal layer at the back side (i.e., BM1) of integrated circuit 100. The plurality of metal lines, including metal lines 110a, 110b, and 110c, are formed in a direction of Y axis and separate from each other in a direction of X axis, which is different from the direction of Y axis.

Step 1006 includes forming a set of active regions in a third layer of the integrated circuit. For example, the semiconductor manufacturing equipment forms a plurality of active regions for CFETS, including CFETs 150a, 150b, 150c, and 150d (FIG. 1), in a transistor layer of the integrated circuit different from the first and second metal layers at the back side (i.e., BM0 and BM1). The plurality of active regions are used to fabricate the CFETs, including CFETs 150a, 150b, 150c, and 150d, of integrated circuit 100 (FIG. 1).

In some embodiments, method 1000 further includes forming a plurality of transistor structures in the transistor layer. The transistor layer includes a plurality of transistor sub-layers. For example, the semiconductor manufacturing equipment further forms a plurality of transistor structures, including NMOS transistor 151 (FIG. 2D), PMOS transistor 152 (FIG. 2D), and MDLI 153 (FIG. 2D) of CFET 150a (FIG. 2D), in integrated circuit 200.

In some embodiments, method 1000 further includes forming a plurality of metal diffusion (MD) structures above and below the transistor layer. For example, the semiconductor manufacturing equipment forms a plurality of MD structures, including MD layer 122 above CFET 150a and BMD layer 164 below CFET 150a (FIG. 2D), in integrated circuit 200.

Step 1008 includes forming a set of gates in the third layer. For example, the semiconductor manufacturing equipment forms a plurality of gates of the CFETs, including CFETs 150a, 150b, 150c, and 150d (FIG. 1), in the transistor layer.

Step 1010 includes forming a third set of conductive structures in a fourth layer of the integrated circuit. For example, the semiconductor manufacturing equipment forms a plurality of metal lines, including metal lines 120a, 120b, and 120c (FIG. 1), in the first metal layer at the front side (i.e., M0) of integrated circuit 100. The plurality of metal lines, including metal lines 120a, 120b, and 120c, are formed in the direction of X axis and are separate from each other in the direction of Y axis. The first metal layer at the front side (i.e., M0) and the second metal layer at the back side (i.e., BM1) in step 1004 are formed on opposite sides of integrated circuit 100 (FIG. 1). Specifically, the first metal layer at the front side (i.e., M0) and the second metal layer at the back side (i.e., BM1) are formed on opposite sides of CFETs 150a, 150b, 150c, and 150d in integrated circuit 100 (FIG. 1). Metal line 120b in the M0 layer and metal line 110a in the BM1 layer are formed on opposite sides of CFET 150a (FIG. 1).

Step 1012 includes forming a first set of vias between the second and third sets of conductive structures. For example, the semiconductor manufacturing equipment forms a plurality of vias, including via 165 (FIG. 2D) and other similar vias between metal lines 110a, 110b, and 110c in the BM1 layer and metal lines 120a, 120b, and 120c in the M0 layer. The plurality of vias are formed to couple metal lines 110a, 110b, and 110c in the BM1 layer to metal lines 120a, 120b, and 120c in the M0 layer. Specifically, the VBT (i.e., via 165) of power tap cell 160a (FIG. 1) is formed to couple metal line 110a in the BM1 layer to metal line 120b in the M0 layer.

In some embodiments, method 1000 further includes forming a plurality of vias between metal layers and metal diffusion layers. For example, the semiconductor manufacturing equipment forms a plurality of vias, including via 161 (i.e., BV0), via 163 (i.e., BVD), and via 121 (i.e., VD) (FIG. 2D) and other similar vias between metal lines 110a, 110b, and 110c in the BM1 layer and metal lines 120a, 120b, and 120c in the M0 layer. The plurality of vias are formed to couple metal lines 110a, 110b, and 110c in the BM1 layer to metal lines 120a, 120b, and 120c in the M0 layer.

In some embodiments, the semiconductor manufacturing equipment forms a plurality of vias, including FTV 360a (FIG. 3A), FTV 460a (FIG. 4A), TSV 560a (FIG. 5A), TSV 660a (FIG. 6A), and/or via wall 760 (FIG. 7A), as described above with reference to FIGS. 3A-7A.

Step 1014 includes forming a fourth set of conductive structures in a fifth layer of the integrated circuit. For example, the semiconductor manufacturing equipment forms a plurality of metal lines, including metal lines 130a and 130b (FIG. 4A) in the second metal layer at the front side (i.e., M1), of integrated circuit 400. The plurality of metal lines, including metal lines 130a and 130b, are formed to extend in the direction of Y axis and are separate from each other in the direction of X axis, which is different from the direction of Y axis.

Step 1016 includes forming a second set of vias between the third and fourth sets of conductive structures. For example, the semiconductor manufacturing equipment forms a plurality of vias, including vias V0 (FIG. 4A), between metal lines 130a and 130b in the M1 layer and metal lines 120a, 120b, and 120c in the M0 layer. The plurality of vias V0 are formed to couple metal lines 130a and 130b in the M1 layer to metal lines 120a, 120b, and 120c in the M0 layer. These vias V0 allow a power level (e.g., $V_{SS}$) to be delivered in different layers at the front side of integrated circuit 400 (FIG. 4A).

In some embodiments, a plurality of pieces of semiconductor manufacturing equipment are configured to perform method 1000 to fabricate integrated circuits 100, 200, 300, 400, 500, 600, and/or 700.

Figure 11:
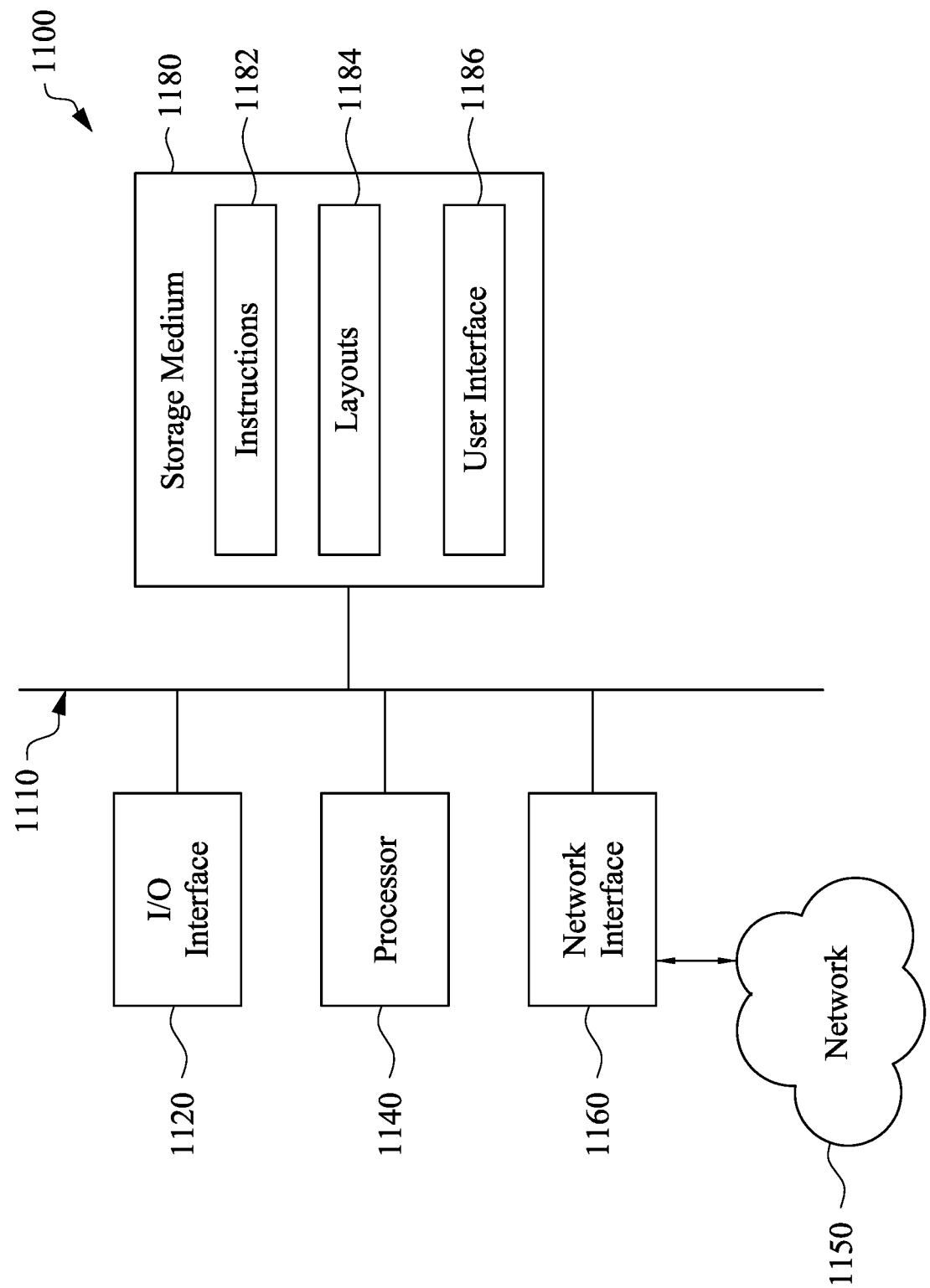
FIG. 11 is a block diagram of an exemplary system for designing and generating an integrated circuit layout, in accordance with some embodiments.

FIG. 11 is a block diagram of an exemplary system 1100 for designing and generating an integrated circuit layout, in accordance with some embodiments. System 1100 is configured to design and generate one or more layouts of integrated circuits 100, 200, 300, 400, 500, 600, and/or 700. In some embodiments, system 1100 is also configured to manufacture one or more integrated circuits based on the one or more layouts of the integrated circuits described herein. System 1100 includes a bus 1110, an input/output (I/O) interface 1120, a processor 1140, a network interface 1160, and a non-transitory, computer-readable storage medium 1180. I/O interface 1120, processor 1140, network interface 1160, and storage medium 1180 are electrically coupled to each other through bus 1110. Network interface 1160 is configured to connect to a network 1150 so that system 1100 is connected to one or more external computer systems and/or equipment through network 1150.

I/O interface 1120 is coupled to external devices for receiving information and commands and provide output information. For example, I/O interface 1120 may be coupled to a keyboard, a keypad, a mouse, a trackball, a trackpad, and/or cursor direction keys for receiving information and commands to system 1100.

Processor 1140 includes a central processing unit (CPU), a multi-core processor, a distributed processing system, an application-specific integrated circuit (ASIC), and/or a hardware processing circuit. Processor 1140 is configured to execute instructions stored in storage medium 1180 to cause system 1100 to perform a portion or all of the steps of methods 900 and/or method 1000. For example, processor 1140 may be configured to design and generate one or more layouts of integrated circuits 100, 200, 300, 400, 500, 600, and/or 700. In some embodiments, processor 1140 is also configured to manufacture one or more integrated circuits 100, 200, 300, 400, 500, 600, and/or 700 based on the one or more layouts.

Network interface 1160 is configured to connect system 1100 to one or more other computer systems and/or equipment (not shown) through network 1150. Network interface 1160 includes one or more wireless network interfaces, e.g., Bluetooth, Wi-Fi, worldwide interoperability for microwave access (WiMAX), general packet radio service (GPRS), and/or wideband code division multiple access (WCDMA) transceivers, and/or one or more wireline network interfaces, e.g., Ethernet, universal serial bus (USB), and/or IEEE-13154 interface cards. In some embodiments, two or more systems 1100 may be configured to perform methods 900 and 1000 and exchange information, e.g., layouts, user interfaces, and fabrication data, among the two or more systems 1100 through network 1150.

Storage medium 1180 includes an electronic, magnetic, optical, electromagnetic, infrared, and/or semiconductor apparatus or device. For example, storage medium 1180 includes a semiconductor or solid-state memory, a magnetic tape, a removable computer diskette, a random-access memory (RAM), a read-only memory (ROM), a rigid magnetic disk, and/or an optical disk. In some embodiments, storage medium 1180 includes a compact disk-read only memory (CD-ROM), a compact disk-read/write (CD-R/W) disc, and/or a digital video disc (DVD).

Storage medium 1180 stores instructions 1182 for causing system 1100 to perform methods 900 and/or 1000. Processor 1140 is configured to execute the instructions 1182 stored in storage medium 1180 to cause system 1100 to perform a portion or all of the steps of methods 900 and/or method 1000. In some embodiments, storage medium 1180 is configured to serve as an interface between system 1100 and semiconductor manufacturing equipment (not shown) for manufacturing integrated circuits.

In some embodiments, storage medium 1180 also stores information for performing methods 900 and/or 1000 and information generated during the performance of methods 900 and/or 1000, such as layouts 1184, user interface 1186, and fabrication data. In some embodiments, layouts 1184 includes one or more layout patterns of integrated circuits 100, 200, 300, 400, 500, 600, and/or 700.

In some embodiments, storage medium 1180 also stores instructions for interfacing with semiconductor manufacturing machines (not shown). The instructions, when executed, cause processor 1140 to generate manufacturing instructions to control the semiconductor manufacturing machines to perform methods 900 and/or 1000 during a manufacturing process.

System 1100 is configured to receive information related to integrated circuit layouts through I/O interface 1120 and/or network interface 1160. The information is transferred, through bus 1110, to processor 1140 for generating layout patterns and data and manufacturing integrated circuits 100, 200, 300, 400, 500, 600, and/or 700. The layout patterns and data are stored in storage medium 1180 as layouts 1184. In some embodiments, system 1100 is also configured to receive information related to a user interface through I/O interface 1120 and/or network interface 1160. The information is stored in storage medium 1180 as user interface 1186. In some embodiments, system 1100 is configured to receive information related to fabrication data through I/O interface 1120 and/or network interface 1160. The information is stored in storage medium 1180. The fabrication data includes fabrication parameters that system 1100 may use to manufacture integrated circuits.

In some embodiments, method 900 or 1000 is implemented as a standalone software application for execution by a processor. In some embodiments, method 900 or 1000 is implemented as a software application that is a part of another software application. In some embodiments, method 900 or 1000 is implemented as a plug-in to a software application. In some embodiments, method 900 or 1000 is implemented as a software application that is a portion of an electronic design automation (EDA) tool. In some embodiments, method 900 or 1000 is implemented as a software application that is used by an EDA tool. The EDA tool is used to generate one or more layouts of the integrated circuits described herein. In some embodiments, the layouts of the integrated circuits are stored on a non-transitory computer-readable medium. In some embodiments, the layouts of the integrated circuits are generated by using a tool such as Cadence® Virtuoso® or other layout generating tools. In some embodiments, the layouts of the integrated circuits are generated based on netlists which are created based on schematic circuit diagrams. In some embodiments, method 900 or 1000 is implemented by a manufacturing device to manufacture the integrated circuits described herein by using a set of masks. The masks are manufactured based on one or more layouts generated by system 1100. In some embodiments, system 1100 generates layouts of the integrated circuits that are smaller than other approaches. In some embodiments, system 1100 generates layouts of integrated circuits 100, 200, 300, 400, 500, 600, and/or 700 that occupy less area than other approaches.

Figure 12:
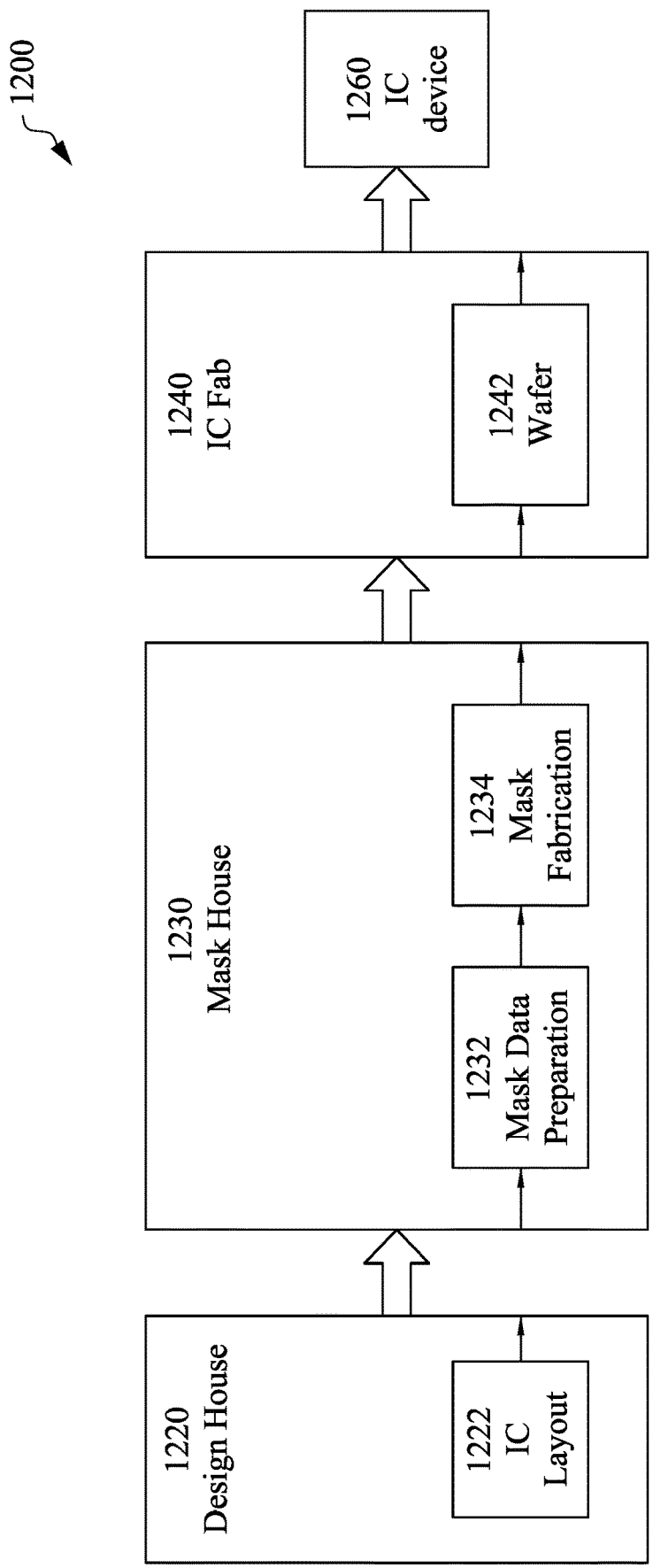
FIG. 12 is a block diagram of an exemplary integrated circuit manufacturing system, in accordance with some embodiments.

FIG. 12 is a block diagram of an exemplary integrated circuit manufacturing system 1200, in accordance with some embodiments. Integrate circuit manufacturing system 1200 includes a design house 1220, a mask house 1230, and an integrated circuit manufacturer or fabricator (Fab) 1240, that interact with one another in the design, development, and manufacturing cycles and/or services related to manufacturing an integrated circuit (IC) device 1260. The components in system 1200 are connected by a communications network. In some embodiments, the communications network is a single network. In some embodiments, the communications network is a variety of different networks, such as an intranet and the Internet. The communications network includes wireline and/or wireless communication channels. Each component interacts with one or more of the other components and provides services to and/or receives services from one or more of the other components. In some embodiments, two or more of design house 1220, mask house 1230, and IC fab 1240 are connected locally. In some embodiments, two or more of design house 1220, mask house 1230, and IC fab 1240 coexist in a common facility and share common resources.

Design house 1220 designs and generates integrated circuit (IC) layout 1222. IC layout 1222 includes geometrical patterns designed for IC device 1260. The geometrical patterns are patterns of metal, oxide, or semiconductor layers that make up the plurality of components of IC device 1260. The semiconductor layers combine to form a plurality of IC features. For example, a portion of IC layout 1222 includes a plurality of IC features, such as active regions, gate electrodes, source electrodes, drain electrodes, metal lines, and vias of interlayer interconnections, and openings for bonding pads, to be formed in a semiconductor substrate (e.g., a silicon wafer) and a plurality of material layers disposed on the semiconductor substrate. Design house 1220 automatically implements a proper design procedure to form IC layout 1222 for the integrated circuits described herein. The design procedure includes one or more of logic design, physical design, and/or place and route. IC layout 1222 is presented in one or more data files including information of the geometrical patterns. For example, IC layout 1222 may be in a GDSII file format or a Design Framework II (DFII) file format.

Mask house 1230 includes mask data preparation 1232 and mask fabrication 1234. Mask house 1230 uses IC layout 1222 to automatically manufacture one or more masks for fabricating a plurality of layers of IC device 1260. Mask house 1230 performs mask data preparation 1232 to translate IC layout 1222 into a representative data file (RDF). Mask data preparation 1232 provides the RDF to mask fabrication 1234. Mask fabrication 1234 includes a mask writer. The mask writer automatically converts the RDF to an image on a substrate, such as a photomask (e.g., reticle) or a semiconductor wafer. IC layout 1222 is manipulated by mask data preparation 1232 to comply with particular characteristics of the mask writer and/or requirements of IC fab 1240. In some embodiments, mask data preparation 1232 and mask fabrication 1234 in FIG. 12 may be collectively referred to as mask data preparation.

In some embodiments, mask data preparation 1232 includes optical proximity correction (OPC) which uses lithography enhancement techniques to compensate for image errors, such as those that may arise from diffraction, interference, other process effects, and the like. The OPC adjusts IC layout 1222. In some embodiments, mask data preparation 1232 includes further resolution enhancement techniques (RET), such as off-axis illumination, sub-resolution assist features, phase-shifting masks, other suitable techniques, and the like or any combinations thereof. In some embodiments, inverse lithography technology (ILT) is also used, which treats the OPC as an inverse imaging problem.

In some embodiments, mask data preparation 1232 includes an automatic mask rule checker (MRC) that checks IC layout 1222 that has undergone processes in the OPC with a set of mask creation rules containing certain geometric and/or connectivity restrictions to ensure sufficient margins and account for variability in semiconductor manufacturing processes and the like. In some embodiments, the MRC modifies IC layout 1222 to compensate for limitations of mask fabrication 1234, which may include the undoing of certain modifications performed by the OPC in order to meet mask creation rules.

In some embodiments, mask data preparation 1232 includes lithography process checking (LPC) that simulates processing that will be implemented by IC fab 1240 to fabricate IC device 1260. LPC simulates this processing based on IC layout 1222 to create a simulated manufactured device for IC device 1260. The processing parameters in the LPC simulation include parameters associated with a plurality of processes of an IC manufacturing cycle, parameters associated with tools used for manufacturing an IC, and/or other aspects of the manufacturing process. The LPC takes into account a plurality of factors, such as aerial image contrast, depth of focus (DOF), mask error enhancement factor (MEEF), other suitable factors, and the like or any combinations thereof. In some embodiments, after a simulated manufactured device has been created by the LPC, if the simulated device is not close enough in shape to satisfy design rules, the OPC and/or MRC are be repeated to further refine IC layout 1222.

The above description of mask data preparation 1232 has been simplified for the purposes of clarity. In some embodiments, mask data preparation 1232 includes additional features such as a logic operation (LOP) to modify the IC design layout according to manufacturing rules. Additionally, the processes applied to IC layout 1222 during mask data preparation 1232 may be executed in a variety of different orders.

After mask data preparation 1232 and during mask fabrication 1234, a mask or a group of masks are fabricated based on the modified IC layout. In some embodiments, an electron-beam (e-beam) or a mechanism of multiple e-beams automatically forms a pattern on a mask (e.g., photomask or reticle) based on the modified IC layout. The mask can be formed in a plurality of technologies. In some embodiments, the mask is formed by using binary technology. In some embodiments, a mask pattern includes opaque regions and transparent regions. A radiation beam, such as an ultraviolet (UV) beam, used to expose the image-sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. As another example, the mask is formed using a phase shift technology. In a phase shift mask (PSM), a plurality of features in the pattern formed on the mask are configured to have proper phase difference to enhance the resolution and imaging quality. In some embodiments, the phase shift mask may be attenuated PSM or alternating PSM. One or more masks generated by mask fabrication 1234 are used in a variety of processes. For example, the masks are used in an ion implantation process to form a plurality of doped regions in a semiconductor wafer, in an etching process to form a plurality of etching regions in the semiconductor wafer, and/or in other suitable processes.

IC fab 1240 is an IC fabrication component that includes one or more manufacturing subcomponents for the fabrication of a variety of different IC products. In some embodiments, IC fab 1240 is a semiconductor foundry. For example, IC fab 1240 includes a first manufacturing subcomponent for the front end fabrication of a plurality of IC products (i.e., front-end-of-line (FEOL) fabrication), a second manufacturing subcomponent for the back end fabrication for the interconnection and packaging of the IC products (i.e., back-end-of-line (BEOL) fabrication), and/or a third manufacturing subcomponent for other services of the foundry entity.

IC fab 1240 uses the one or more masks fabricated by mask house 1230 to fabricate IC device 1260. Thus, IC fab 1240 at least indirectly uses IC layout 1222 to fabricate IC device 1260. In some embodiments, a semiconductor wafer 1242 is fabricated by IC fab 1240 using the one or more masks to form IC device 1260. Semiconductor wafer 1242 includes a silicon substrate or other proper substrate having material layers formed thereon. Semiconductor wafer 1242 further includes one or more doped regions, dielectric features, multilevel interconnects, and the like formed at subsequent manufacturing steps.

System 1200 is shown as having design house 1220, mask house 1230, and IC fab 1240 as separate components. However, it is understood that one or more of design houses 1220, mask houses 1230, and/or IC fabs 1240 can be part of the same components.

Details regarding an integrated circuit manufacturing system (e.g., system 1200 in FIG. 12) and an IC manufacturing flow associated therewith can be found in, e.g., U.S. Pat. No.

9,256,709, granted Feb. 9, 2016; U.S. Pre-Grant Publication No. 20150278429, published October 1; 2015, U.S. Pre-Grant Publication No. 20100040838, published Feb. 6, 2014; and U.S. Pat. No. 7,260,442, granted Aug. 21, 2007, the entireties of each of which are hereby incorporated by reference.

As explained above, this disclosure relates to an integrated circuit that delivers power from a first side of the integrated circuit to a second side of the integrated circuit. A first type of the integrated circuit is configured to deliver power from a first side to the front side by a plurality of power tap cells. For example, integrated circuit 200 delivers power from the back side to the front side by a plurality of power tap cells. The usage of the power tap cells allows integrated circuit 200 to have continual metal lines, e.g., 140*a*, 140*b*, and 140*c* (FIG. 2A), to distribute a positive voltage level $V_{DD}$. The continual metal lines 140*a*, 140*b*, and 140*c* (BM0), i.e., continual power rails, simplify a power delivery network in integrated circuit 200. However, the high via resistance $R_C$ in each power tap cell may cause a high density of the power tap cells in integrated circuit 200. As explained above with reference to FIG. 2B, the power tap cells are used every two-cell height. Such a density of the power tap cells results in an area penalty to integrated circuit 200.

A second type of the integrated circuit is configured to deliver power from a first side to the front side by a plurality of FTVs. For example, integrated circuit 300 delivers power from the back side to the front side by a plurality of FTVs. The FTVs have lower via resistance $R_C$, as compared with that of the power tap cells in integrated circuit 200 (FIG. 2A). This may result in a lower density of the power tap cells in integrated circuit 300 and therefore a less area penalty. However, the FTVs require additional FTV processes during manufacturing integrated circuit 300. In addition, metal line 340*b* (i.e., BM0 ($V_{DD}$) in FIG. 3A) is not continual. Integrated circuit 300 requires additional metal lines to provide the positive voltage $V_{DD}$ in the back side. As another example, integrated circuit 400 also delivers power from the back side to the front side by a plurality of FTVs. Integrated circuit 400 also delivers power from the back side to metal line 440*b* in the first metal layer at the back side.

A third type of the integrated circuit is configured to deliver power from a first side to the front side by a plurality of TSVs. For example, integrated circuit 600 delivers power from the back side to the front side by a plurality of TSVs. The TSVs each have lower via resistance $R_C$, as compared with that of the power tap cells in integrated circuit 200 (FIG. 2A). This may result in a lower density of the power tap cells in integrated circuit 600 and therefore a less area penalty. However, the TSVs require additional TSV processes when manufacturing integrated circuit 600. In addition, it is also necessary to follow TSV keep-out rules when manufacturing integrated circuit 600. As another example, integrated circuit 500 also delivers power from the back side to the front side by a plurality of TSVs. Integrated circuit 500 also delivers power from the back side to metal line 540*b* in the first metal layer at the back side.

A fourth type of the integrated circuit is configured to deliver power from a first side to the front side by a plurality of via walls. For example, integrated circuit 700 delivers power from the back side to the front side by a plurality of via walls. The usage of the via walls allows integrated circuit 700 to deliver power without power tap cells. This avoids an area penalty in integrated circuit 700. However, the via walls requires additional via wall processes during the manufacturing of integrated circuit 700. The height of the via walls also needs to be higher than that of vias in other circuits.

One aspect of this disclosure relates to an integrated circuit with a first power rail, a second power rail, and a power tap cell. In some embodiments, the first power rail is at a first side of the integrated circuit. In some embodiments, the second power rail is at a second side of the integrated circuit. In some embodiments, the power tap cell is coupled to the first power rail and the second power rail and configured to provide power from the first power rail to the second power rail.

Another aspect of this disclosure relates to an integrated circuit with a first power rail, a second power rail, and a via wall. In some embodiments, the first power rail is at a first side of the integrated circuit. In some embodiments, the second power rail is at a second side of the integrated circuit. In some embodiments, the via wall is coupled between the first power rail and the second power rail and configured to provide power from the first power rail to the second power rail.

Still another aspect of this disclosure relates to a method for power delivery in an integrated circuit. The method includes providing power from a first power rail at a first side of an integrated circuit to a second power rail at a second side of the integrated circuit through a power tap cell. In some embodiments, the method also includes delivering the power to a component of the integrated circuit through the second power rail. In some embodiments, the method also includes delivering the power to a third power rail at the second side of the integrated circuit.

Specific examples of metal lines, layers, sides, and component dimensions have been provided. However, these examples are not intended to be limiting. Persons of ordinary skill will now understand that the embodiments herein can be practiced with equal effectiveness with components having other metal lines, layers, sides, and dimensions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make a plurality of changes, substitutions, and alterations herein without departing from the spirit and scope of the present disclosure.

What is claimed is:

1. An integrated circuit, comprising:
   a first power rail extending along a first direction at a first side of the integrated circuit;
   a second power rail extending along a second direction at a second side of the integrated circuit, the first and second sides being on opposite sides of at least a complementary field effect transistor; and
   a power tap cell extending along a third direction and coupled between the first power rail and the second power rail and configured to provide power from the first power rail to the second power rail,
   wherein the first direction, the second direction, and the third direction are respectively along first, second, and third axes of a three-dimensional coordinate system.

2. The integrated circuit of claim 1, further comprising:
   one or more complementary field effect transistors,
   wherein:

the first side is a back side of the integrated circuit;
the second side is a front side of the integrated circuit; and
the first power rail is configured to provide a negative voltage level to the integrated circuit.

3. The integrated circuit of claim 1, wherein the power tap cell comprises a first via, a metal layer, a second via, a first metal diffusion (MD) layer, and a third via, wherein:
the first via is coupled between the first power rail and the metal layer;
the metal layer is coupled between the first via and the second via;
the second via is coupled between the metal layer and the first MD layer;
the first MD layer is coupled between the second via and the third via;
the third via is coupled between the first MD layer and a second MD layer; and
the second MD layer is coupled to the second power rail through a fourth via.

4. The integrated circuit of claim 3, wherein the metal layer is a first metal layer, the integrated circuit further comprising:
a second metal layer and a third metal layer at the first side,
wherein:
the first power rail is in the third metal layer at the first side;
the first side is a back side of the integrated circuit; and
the second side is a front side of the integrated circuit.

5. The integrated circuit of claim 4, further comprising:
a third power rail at the first side,
wherein:
the third power rail is in the second metal layer at the first side;
the first power rail is configured to provide a negative voltage level to the integrated circuit; and
the third power rail is configured to provide a positive voltage level to the integrated circuit.

6. The integrated circuit of claim 3, wherein the metal layer is a first metal layer, the integrated circuit further comprising:
a metal line in a second metal layer at the second side,
wherein:
the second power rail includes the metal line in the second metal layer at the second side;
the first side is a back side of the integrated circuit; and
the second side is a front side of the integrated circuit.

7. The integrated circuit of claim 1, wherein the power tap cell comprises a feed-through via coupled between the first power rail and the second power rail.

8. The integrated circuit of claim 7, further comprising:
a first metal layer and a second metal layer at the first side; and
a third metal layer at the second side,
wherein:
the first power rail is in the second metal layer at the first side;
the second power rail is in the third metal layer at the second side;
the first side is a back side of the integrated circuit; and
the second side is a front side of the integrated circuit.

9. The integrated circuit of claim 8, further comprising:
a third power rail at the first side,
wherein:
the third power rail is in the first metal layer at the first side;
the first power rail is configured to provide a negative voltage level to the integrated circuit; and
the third power rail is configured to provide a positive voltage level to the integrated circuit.

10. The integrated circuit of claim 1, wherein the power tap cell comprises a feed-through via and a metal line in a metal layer at the first side, wherein:
the feed-through via is coupled between the first power rail and the second power rail through the metal line; and
the metal line is provided with the power from the first power rail.

11. The integrated circuit of claim 10, wherein the metal layer is a first metal layer at the first side and the integrated circuit further comprises:
a second metal layer at the first side,
wherein:
the first power rail is in the second metal layer at the first side;
the first side is a back side of the integrated circuit; and
the second side is a front side of the integrated circuit.

12. The integrated circuit of claim 11, further comprising:
a first metal line in a third metal layer and a second metal line in a fourth metal layer at the second side; and
a via coupled between the first metal line and the second metal line at the second side,
wherein the second power rail includes the first metal line in the third metal layer at the second side.

13. The integrated circuit of claim 1, wherein the power tap cell comprises a through-silicon via (TSV) and a metal line in a metal layer at the first side, wherein:
the TSV is coupled between the first power rail and the second power rail through the metal line; and
the metal line is provided with the power from the first power rail.

14. The integrated circuit of claim 13, wherein the metal layer is a first metal layer at the first side, and the integrated circuit further comprises:
a second metal layer at the first side,
wherein:
the first power rail is in the second metal layer at the first side;
the first side is a back side of the integrated circuit; and
the second side is a front side of the integrated circuit.

15. The integrated circuit of claim 14, further comprising:
a first metal line in a third metal layer and a second metal line in a fourth metal layer at the second side; and
a via coupled between the first metal line and the second metal line at the second side,
wherein the second power rail includes the second metal line in the fourth metal layer at the second side.

16. The integrated circuit of claim 1, wherein the power tap cell comprises a through-silicon via (TSV), wherein the TSV is coupled between the first power rail and the second power rail.

17. The integrated circuit of claim 16, further comprising:
a metal layer at the first side; and
a metal layer at the second side,
wherein:
the first power rail is in the metal layer at the first side;
the second power rail is in the metal layer at the second side;
the first side is a back side of the integrated circuit; and
the second side is a front side of the integrated circuit.

18. An integrated circuit, comprising:
a plurality of complementary field effect transistors;

a first power rail extending along a first direction at a first side of the integrated circuit;
a second power rail extending along a second direction at a second side of the integrated circuit, the first and second sides being on opposite sides of the plurality of complementary field effect transistors; and
a through-silicon via (TSV) extending along a third direction and coupled between the first power rail at the first side and the second power rail at the second side,
wherein the first direction, the second direction, and the third direction are respectively along first, second, and third axes of a three-dimensional coordinate system.

19. The integrated circuit of claim 18, further comprising:
a metal line in a metal layer at the second side,
wherein the TSV extends through the metal line.

20. An integrated circuit, comprising:
a plurality of complementary field effect transistors;
a first power rail extending along a first direction at a first side of the integrated circuit;
a second power rail extending along a second direction at a second side of the integrated circuit, the first and second sides being on opposite sides of the plurality of complementary field effect transistors; and
a feed-through via extending along a third direction and coupled between the first power rail at the first side and the second power rail at the second side,
wherein the first direction, the second direction, and the third direction are respectively along first, second, and third axes of a three-dimensional coordinate system.

* * * * *